US010290498B2

(12) United States Patent
Mitsugi et al.

(10) Patent No.: US 10,290,498 B2
(45) Date of Patent: May 14, 2019

(54) IMPRINT APPARATUS AND IMPRINT METHOD

(71) Applicant: TOSHIBA MEMORY CORPORATION, Tokyo (JP)

(72) Inventors: Satoshi Mitsugi, Kanagawa (JP); Takeshi Suto, Kanagawa (JP); Takashi Sato, Kanagawa (JP); Yukiyasu Arisawa, Tokyo (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/918,555

(22) Filed: Mar. 12, 2018

(65) Prior Publication Data

US 2019/0080899 A1 Mar. 14, 2019

(30) Foreign Application Priority Data

Sep. 14, 2017 (JP) ................................ 2017-176970

(51) Int. Cl.

*H01L 21/027* (2006.01)
*H01L 23/544* (2006.01)
*G03F 7/00* (2006.01)
*H01L 21/66* (2006.01)

(52) U.S. Cl.

CPC .......... *H01L 21/027* (2013.01); *G03F 7/0002* (2013.01); *H01L 22/20* (2013.01); *H01L 23/544* (2013.01); *H01L 2223/54426* (2013.01)

(58) Field of Classification Search

CPC ..... H01L 21/027; H01L 23/544; H01L 22/20; H01L 2223/54426; G03F 7/0002
See application file for complete search history.

(56) References Cited

U.S. PATENT DOCUMENTS 5,702,567 A 12/1997 Mitsui et al.
5,917,205 A 6/1999 Mitsui et al.
8,842,294 B2 9/2014 Minoda et al.
9,595,447 B2 3/2017 Inada et al.
(Continued)

FOREIGN PATENT DOCUMENTS

JP 09-102457 A 4/1997
JP 2002-64055 A 2/2002
(Continued)

*Primary Examiner* — Karen Kusumakar

(74) *Attorney, Agent, or Firm* — Finnegan, Henderson, Farabow, Garrett & Dunner, L.L.P.

(57) ABSTRACT

According to an embodiment, a first alignment mark includes a first template-side mark in which a plurality of first portions are arranged with a first period, and a second template-side mark in which a plurality of second portions are arranged with a second period. A second alignment mark includes a first wafer-side mark in which a plurality of third portions are arranged with a third period, and a second wafer-side mark in which a plurality of fourth portions are arranged with a fourth period. The first wafer-side mark and the first template-side mark are configured to be overlaid with each other to constitute a first moire mark. The second wafer-side mark and the second template-side mark are configured to be overlaid with each other to constitute a second moire mark. An average period of the first moire mark and an average period of the second moire mark are different from each other.

18 Claims, 28 Drawing Sheets

(56) References Cited

U.S. PATENT DOCUMENTS

| | | | | |
|---|---|---|---|---|
| 2002/0180067 | A1* | 12/2002 | Hoshi | H01L 23/544 257/797 |
| 2008/0094629 | A1* | 4/2008 | Wu | G03F 9/7003 356/401 |
| 2012/0244319 | A1* | 9/2012 | Wuister | B82Y 10/00 428/156 |
| 2016/0297117 | A1* | 10/2016 | Sato | G02B 27/141 |

FOREIGN PATENT DOCUMENTS

| | | | |
|---|---|---|---|
| JP | 2002-359171 | A | 12/2002 |
| JP | 4848832 | B2 | 12/2011 |
| JP | 5658271 | B2 | 12/2014 |
| JP | 2015-90421 | A | 5/2015 |
| JP | 5713961 | B2 | 5/2015 |
| JP | 2015-138963 | A | 7/2015 |
| JP | 5932859 | B2 | 6/2016 |
| JP | 5943717 | B2 | 7/2016 |

* cited by examiner

IMPRINT APPARATUS AND IMPRINT METHOD

CROSS-REFERENCE TO RELATED APPLICATIONS

This application is based upon and claims the benefit of priority from Japanese Patent Application No. 2017-176970, filed on Sep. 14, 2017; the entire contents of which are incorporated herein by reference.

FIELD

Embodiments described herein relate generally to an imprint apparatus and an imprint method.

BACKGROUND

An imprint method has been proposed as a method for forming fine patterns. In the imprint method, a resist is applied onto a processing object matter. Then, the resist is pressed by a template provided with fine patterns, and recessed portions of the template are thereby filled with the resist. Then, the resist is irradiated with ultraviolet rays, and is thereby cured. The resist separated from the template is used as a mask for processing the processing object matter.

In an imprint process, a positioning process between the template and the processing object matter is performed. This positioning process is performed by using alignment marks provided on respective ones of the template and the processing object matter. The alignment marks have predetermined shapes and are arranged in Kerf regions, and thus the arrangement flexibility of the alignment marks is low.

DETAILED DESCRIPTION

In general, according to one embodiment, an imprint apparatus includes a template holder, a processing object holder, a monitor, and a first moving part. The template holder holds a template that includes a first alignment mark detecting displacement in a first direction. The processing object holder holds a processing object that includes a second alignment mark detecting displacement in the first direction. The monitor optically monitors a state where the first alignment mark and the second alignment mark are overlaid with each other. The first moving part moves at least one of the template holder and the processing object holder in the first direction, on a basis of a monitoring result obtained by the monitor. The first alignment mark includes a first template-side mark and a second template-side mark. The first template-side mark includes a first pattern in which a plurality of first portions are arranged with a first period in the first direction. The second template-side mark includes a second pattern in which a plurality of second portions are arranged with a second period in the first direction. The second alignment mark includes a first wafer-side mark and a second wafer-side mark. The first wafer-side mark includes a third pattern in which a plurality of third portions are arranged with a third period in the first direction. The second wafer-side mark includes a fourth pattern in which a plurality of fourth portions are arranged with a fourth period in the first direction. The first wafer-side mark and the first template-side mark are configured to be overlaid with each other to constitute a first moire mark. The second wafer-side mark and the second template-side mark are configured to be overlaid with each other to constitute a second moire mark. An average period of the first moire mark and an average period of the second moire mark are different from each other.

Exemplary embodiments of an imprint apparatus and an imprint method will be explained below in detail with reference to the accompanying drawings. The present invention is not limited to the following embodiments.

First Embodiment

In the following description, an explanation will be first given of the size and arranging method of alignment marks according to a comparative example, and then an explanation will be given of an imprint apparatus, an imprint method, and a semiconductor device manufacturing method, which use alignment marks according to an embodiment.

Figure 1:
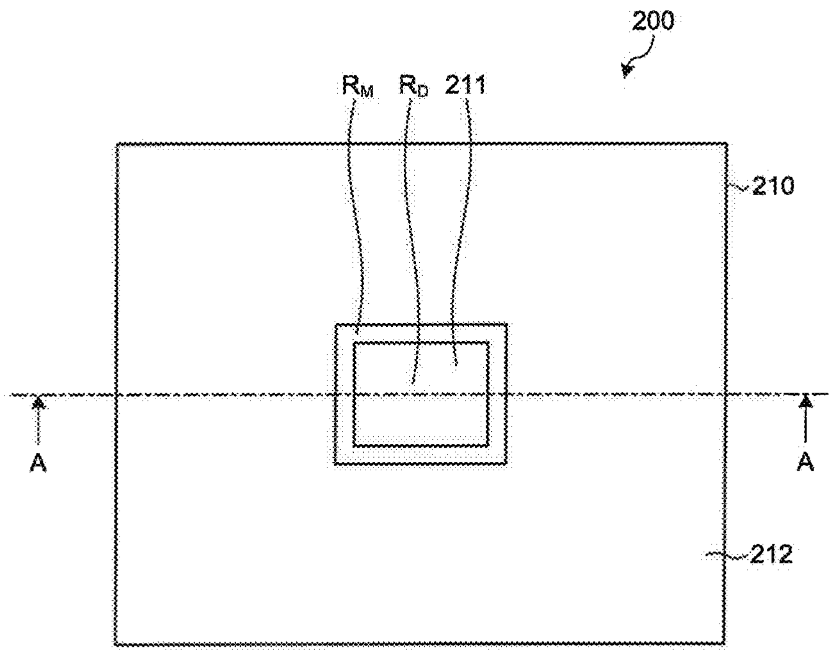
FIG. 1 is a top view illustrating a structural example of a template.
Figure 2:
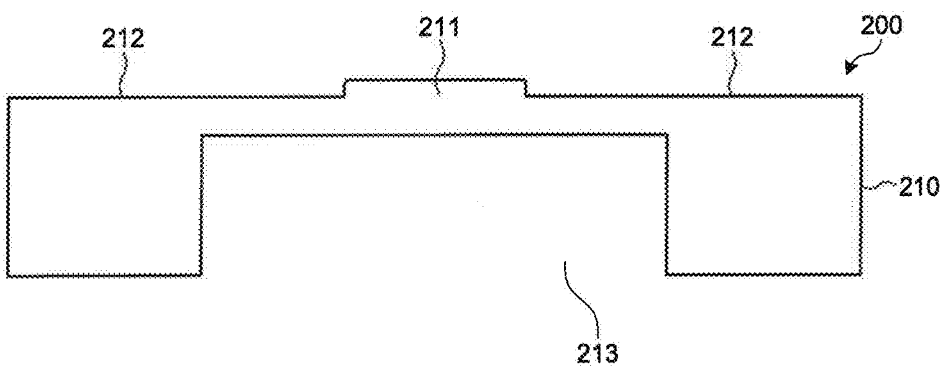
FIG. 2 is a sectional view illustrating the structural example of the template, which is a sectional view taken along a line A-A of FIG. 1.

FIG. 2 is a top view illustrating a structural example of a template. FIG. 2 is a sectional view illustrating the structural example of the template, which is a sectional view taken along a line A-A of FIG. 1. The template (mold) 200 has been prepared by processing a rectangular template substrate 210. The template substrate 210 includes a mesa part 211 and an off-mesa part 212 on the upper surface side, such that the mesa part 211 is at and near the center and serves as a pattern arrangement region provided with a concave-convex pattern, and the off-mesa part 212 is formed of a region other than the mesa part 211. The mesa part 211 has a mesa structure projected with respect to the off-mesa part 212. The mesa part 211 is configured to come into contact with a resist on wafer (substrate) (not illustrated) that is a processing object during an imprint process. Further, the template substrate 210 includes a recessed part (bore) 213 formed in the lower surface. The recessed part 213 is arranged to include a region corresponding to the mesa part 211 that is on the upper surface side. The template substrate 210 is preferably made of a material that transmits ultraviolet rays. For example, the template substrate 210 is made of quartz glass or the like.

The mesa part 211 includes a device formation pattern arrangement region $R_D$, in which a device formation pattern for forming a device pattern on the wafer is arranged, and a mark arrangement region $R_M$, in which a mark or the like to be used during the imprint process is arranged. The mark arrangement region $R_M$ is a frame-like region arranged at the peripheral side of the rectangular mesa part 211, for example. The device formation pattern arrangement region $R_D$ is a region of the mesa part 211 other than the mark arrangement region $R_M$. For example, the device formation pattern includes a line-and-space pattern or the like, in which recessed patterns that extend are arranged at predetermined intervals in a direction intersecting with the extending direction.

The mark arrangement region $R_M$ is provided with an alignment mark or the like for performing positioning between the template 200 and the wafer.

Figure 3:
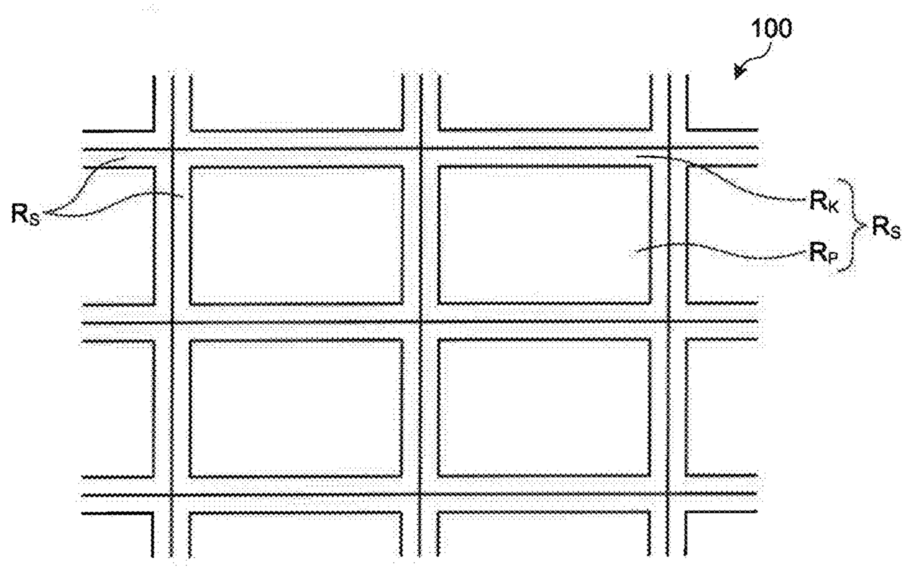
FIG. 3 is a partial top view illustrating a configuration example of shot regions of a wafer.

FIG. 3 is a partial top view illustrating a configuration example of shot regions of the wafer. A plurality of shot regions $R_S$ are provided on the wafer 100. Each of the shot regions $R_S$ includes a Kerf region $R_K$ that is a frame-like region at the peripheral side of the shot region $R_S$, and a rectangular pattern region $R_P$ inside the Kerf region $R_K$. The pattern region $R_P$ is provided with a pattern to be transferred onto the wafer 100 or a layer to be processed on the wafer 100 that is a processing object. The Kerf region $R_K$ is provided with the alignment mark or the like. Each shot region $R_S$ has the same contour and shape as those of the mesa part 211 of the template 200. The Kerf region $R_K$ is arranged at the position corresponding to the mark arrangement region $R_M$ of the template 200. The pattern region $R_P$ is arranged at the position corresponding to the device formation pattern arrangement region $R_D$ of the template 200. Further, the alignment mark of the Kerf region $R_K$ is provided to correspond to the alignment mark of the mark arrangement region $R_M$ of the template 200.

Each of the alignment marks provided on the template 200 and the wafer 100 includes, for example, a diffraction grating pattern. For example, the diffraction grating pattern is composed of a so-called line-and-space pattern, in which a plurality of extending line patterns are arranged in parallel with each other and at predetermined intervals in a direction intersecting with the extending direction. Here, two directions orthogonal to each other provided on each of the template substrate 210 and the wafer 100 will be referred to as "X-direction" and "Y-direction". In order to detect the X-direction component and Y-direction component of a positional deviation between the template 200 and the wafer 100, the alignment marks include a diffraction grating pattern extending in the X-direction and a diffraction grating pattern extending in the Y-direction. Each of the alignment marks may include both of a diffraction grating pattern extending in the X-direction and a diffraction grating pattern extending in the Y-direction, or may include only a diffraction grating pattern extending in either one of the X-direction and the Y-direction.

Figure 4:
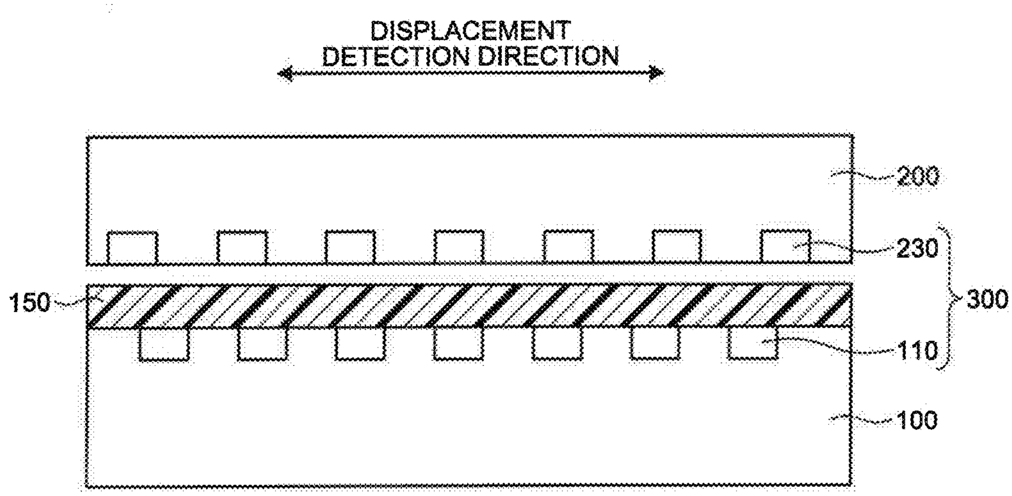
FIG. 4 is a sectional view schematically illustrating an example of positioning between the wafer and the template.

Next, an explanation will be given of positioning performed by using the alignment mark provided on the wafer 100 and the alignment mark provided on the template 200. FIG. 4 is a sectional view schematically illustrating an example of positioning between the wafer and the template. First, a resist 150 is applied onto the wafer 100. Then, by using a rough detection mark (not illustrated) provided on the wafer 100 and a rough detection mark (not illustrated) provided on the template 200, rough detection is performed for coarse positioning between the wafer 100 and the template 200. The rough detection is performed at a high rate in a nondestructive way, and the positional accuracy is low because the distance between the marks is large. The positional accuracy (positional deviation) at this time is denoted by Δx. This positional deviation becomes an initial error at the next positioning to be performed by using a moire mark 300.

Then, as illustrated in FIG. 4, the template 200 is brought into contact with the resist 150 on the wafer 100, and, in this state, precise positioning is performed by using alignment marks 230 and 110. Specifically, a dark field optical system is used to monitor the alignment mark 230 of the template 200 and the alignment mark 110 of the wafer 100, which are overlaid with each other, and the remaining part of the positional deviation is adjusted by a highly accurate positioning technique that uses a moire image generated at this time. Here, a moire mark 300 means alignment marks used for a method for performing alignment while projecting an enlarged image of a positional deviation by using a moire image. Specifically, the moire mark 300 is a combination of the alignment mark 230 on the template 200 side and the alignment mark 110 on the wafer 100 side, which are used for forming a moire image. Here, the rough detection and the highly accurate positioning described above are performed by using alignment scopes.

The moire mark 300 is composed of, for example, a so-called line-and-space pattern, in which line patterns are periodically arrayed in a direction intersecting with their extending direction. The line patterns are patterns provided on, for example, the template 200 or the wafer 100. The direction in which the line patterns are arrayed is a displacement detection direction. The structural period of the alignment mark 110 on the wafer 100 side and the structural period of the alignment mark 230 on the template 200 side are set to be slightly different from each other. With this arrangement, when the alignment mark 110 on the wafer 100 side and the alignment mark 230 on the template 200 side are overlaid with each other, a moire image is generated.

Where the period of the alignment mark 230 on the template 200 side and the period of the alignment mark 110 on the wafer 100 side are respectively denoted by $P_T$ and $P_W$, the average period $P_{ave}$ of the two alignment marks 230 and 110 that generate a moire image is expressed by the following formula (1), and the moire period $P_M$ is expressed by the following formula (2).

$$P_{ave}=(P_T+P_W)/2 \tag{1}$$

$$P_M = C\frac{P_{ave}^2}{|P_T - P_W|} \tag{2}$$

Here, C denotes a coefficient that can change depending on the moire observation method, and the two-dimensional structures of the alignment marks 230 and 110. For example, where two alignment marks, each of which is composed of a one-dimensional pattern, are observed from directly above, C=1 is obtained. Alternatively, where one alignment mark is composed of a one-dimensional pattern, while the other alignment mark is composed of a checkered pattern, which is a two-dimensional pattern, and these alignment marks are observed from directly above, C=1/2 is obtained. This is because, when the checkered pattern is deviated by a half period from the one-dimensional pattern, the checkered pattern looks like the same pattern as the one-dimensional pattern with a different phase.

By observing the moire image, it is possible to perform detection by enlarging a displacement amount by a magnification ratio of $P_M/P_{ave}$, and thereby to obtain positional accuracy exceeding the optical resolution. As described above, the alignment marks 230 and 110 on the template 200 side and wafer 100 side are different in period (pitch) from each other to some extent. If the difference in period is too larger, the magnification ratio becomes smaller, or the number of periodic patterns composing one moire period becomes smaller, and the positional accuracy is thereby lowered. This is because a moire image is premised to be a smooth image substantially the same as a sine wave in theory, but looks blurred discrete patterns in practice; therefore, as the number of periodic patterns composing one moire period is reduced, the period of periodic patterns becomes closer to the moire period, and it becomes difficult to block off a false peak and/or fringe (an optical higher harmonic) by an optical system. For example, in order to enlarge the displacement amount by five times or more, it is necessary to set the ratio between the periods of the alignment marks 230 and 110 on the template 200 side and wafer 100 side to fall within a range of about 1.2 times or less. Accordingly, the periods of the alignment marks 230 and 110 on the template 200 side and wafer 100 side are preferably set to fall within a range of difference equal to or less than about 10% from the average period $P_{ave}$.

Here, in the moire mark 300, there is clearly a lower limit of size in practical use. If the positional deviation amount Δx remaining from the rough detection stage is not less than about half the average period $P_{ave}$, the periodic patterns may shift from the original position by a degree in units of just one period, and make it difficult to correctly perform position detection. Accordingly, the moire mark 300 needs to be composed with a structural period twice or more the positional error expected in the rough detection. Thus, the moire mark 300 is composed to satisfy the condition of the following formula (3). However, in a case where one of the alignment marks is a checkered pattern, the moire mark 300 is composed to satisfy the condition of the following formula (4).

$$\Delta x<P_{ave}/2 \tag{3}$$

$$\Delta x<P_{ave}/4 \tag{4}$$

Further, when the initial error is large while the moire mark 300 is small, the moire image shifts significantly, and the peak position of the moire image may go out from the moire mark 300, and make it impossible to detect the displacement. Accordingly, the moire mark 300 needs to have a size that can at least generate one period of the moire image. In practice, however, in consideration of influences given by a displacement amount detecting method for the moire image and by noises derived from stray light, the moire mark 300 may need to have a size for two to three periods of the moire image. Where the necessary moire period is denoted by N, the lower limit L of the size of the moire mark 300 is expressed by the following formula (5). Here, the periodic difference ΔP between the alignment marks 230 and 110 on the template 200 side and wafer 100 side is expressed by $|P_T-P_W|$.

$$L = NC\frac{P_{ave}^2}{|P_T - P_W|} > 4NC\frac{\Delta x^2}{\Delta P} \quad (5)$$

The lower limit of the size of the moire mark 300 is defined by this formula (5). In a typical example, where the rough detection error is less than 0.5 μm, the alignment mark 230 on the template 200 side is composed of a pattern of lines, and the alignment mark 110 on the wafer 100 side is composed of a checkered pattern, the average period $P_{ave}$ of the moire mark 300 is preferably set to 2 μm or more. For example, where $P_T$=2.06 μm and $P_W$=1.94 μm are given, one period of the moire image is composed of periodic patterns of about 8.3 periods, and the minimum configuration size becomes 16.7 μm. If three periods of the moire image is required to perform position observation, the lower limit of the size of the moire mark 300 becomes 50 μm, below which the moire mark 300 cannot be formed.

In the direction of the moire mark 300 orthogonal to the displacement detection, no specific restriction is applied thereto, but, in practice, there is a preferable size in consideration of the resolution and/or SN (signal to noise ratio) of an optical system. Further, other than these, in practical use, in order to detect displacement in two-dimensional directions, it is required to provide the moire mark 300 in each of two directions, such as X- and Y-directions. On the other hand, in practice, an alignment mark needs to be contained in a suitable rectangular region, because of a technical request that the alignment mark should be recognizable as an alignment mark by an observation device. With these requirements, the lower limit of the area occupied by the moire mark 300 becomes L.

In practical use, in order to perform detection in one direction, there is a method that combines a single moire mark 300 with a pattern indicating a reference position, and a method that combines two regions designed to cause moire images to move in directions opposite to each other with respect to the displacement. In the latter method, the displacement can be detected only by measuring the relative positional relationship between the two moire images (differential detection) without consideration of the reference position, and the displacement amount can be enlarged by twice. Further, in ordinary situations, it is required to find displacement in directions on two-dimensional plane. Accordingly, in the latter method, in order to detect displacement in the X-direction, and the Y-direction intersecting therewith (or orthogonal thereto), and to set two regions in each direction, a moire mark including four regions are provided.

Figure 5:
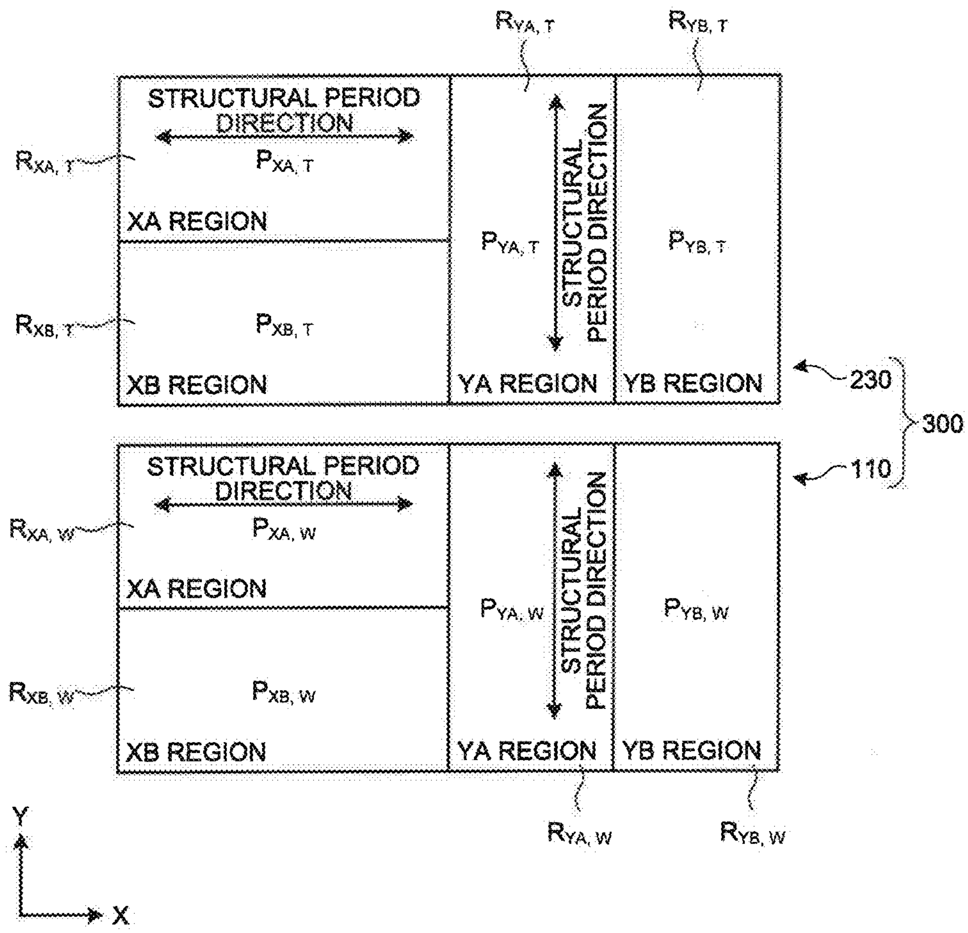
FIG. 5 is a diagram illustrating a configuration example of a moire mark according to a comparative example.

FIG. 5 is a diagram illustrating a configuration example of a moire mark according to a comparative example. The moire mark 300 is composed of an alignment mark 230 on the template 200 side and an alignment mark 110 on the wafer 100 side. Here, on the template 200 and the wafer 100, the X-direction and the Y-direction perpendicular to the X-direction are set. In the comparative example, the alignment marks 230 and 110 on the template 200 side and wafer 100 side are configured such that only one type of the average period $P_{ave}$ is present.

FIG. 5 illustrates an example of a moire mark 300 that can perform positioning without necessitating a reference position. Here, the moire mark 300 includes an A region and a B region as two regions adjacent to each other, which are designed to cause their moire images to move in directions opposite to each other in positioning, i.e., to perform differential detection. Specifically, the alignment mark 230 on the template 200 side includes an XA region $R_{XA,T}$, an XB region $R_{XB,T}$, a YA region $R_{YA,T}$, and a YB region $R_{YB,T}$. Further, the alignment mark 110 on the wafer 100 side has the same mark arrangement configuration as that of the alignment mark 230 on the template 200 side, and include an XA region $R_{XA,W}$, an XB region $R_{XB,W}$, a YA region $R_{YA,W}$, and a YB region $R_{YB,W}$. The XA regions $R_{XA,T}$ and $R_{XA,W}$ and the XB regions $R_{XB,T}$ and $R_{XB,W}$ are regions to perform differential detection in the X-direction, and are regions where marks to detect displacement in the X-direction are arranged. The YA regions $R_{YA,T}$ and $R_{YA,W}$ and the YB regions $R_{YB,T}$ and $R_{YB,W}$ are regions to perform differential detection in the Y-direction, and are regions where marks to detect displacement in the Y-direction are arranged.

The structural periods of marks (template-side marks) arranged in respective ones of the XA region $R_{XA,T}$, the XB region $R_{XB,T}$, the YA region. $R_{YA,T}$, and the YB region $R_{YB,T}$ of the template 200 are denoted by $P_{XA,T}$, $P_{XB,T}$, $P_{YA,T}$, and $P_{YB,T}$, respectively. Further, the structural periods of marks (wafer-side marks) arranged in respective ones of the XA region $R_{XA,W}$, the XB region $R_{XB,W}$, the YA region $R_{YA,W}$, and the YB region $R_{YB,W}$ of the wafer 100 are denoted by $P_{XA,W}$, $P_{XB,W}$, $P_{YA,W}$, and $P_{YB,W}$, respectively.

Here, $P_{ij,T} \neq P_{ij,W}$ (i=X or Y, and j=A or B) holds, and the difference of each of the periods $P_{ij,T}$ and $P_{ij,W}$ from the average period $P_{ij,ave}$ falls within a range of 10% or less, as described above. In consideration of simplicity and symmetry of the design, $P_{iA,T}=Pi_{B,W}$ and $P_{iA,W}=P_{iB,T}$ may hold, or $P_{Xj,k}=P_{Yj,k}$ (k=T or W) may hold. The configuration described above is the basic configuration of the moire mark 300. Here, the average period of the structural periods in this case is denoted by $P_{ave}$. In other words, in the comparative example, the moire mark 300 includes one combination of the alignment marks 230 and 110 on the template 200 side and wafer 100 side, and their average period is $P_{ave}$.

As described above, in the comparative example, the area occupied by the moire mark 300 has a lower limit. Hereinafter, an explanation will be given of a moire mark 300 that can reduce the area of the moire mark 300 to be smaller than that of the comparative example while sustaining positioning accuracy at the same level as that of the comparative example. Further, an explanation will be given of an imprint apparatus, an imprint method, and a semiconductor device manufacturing method, which use the moire mark 300.

Figure 6:
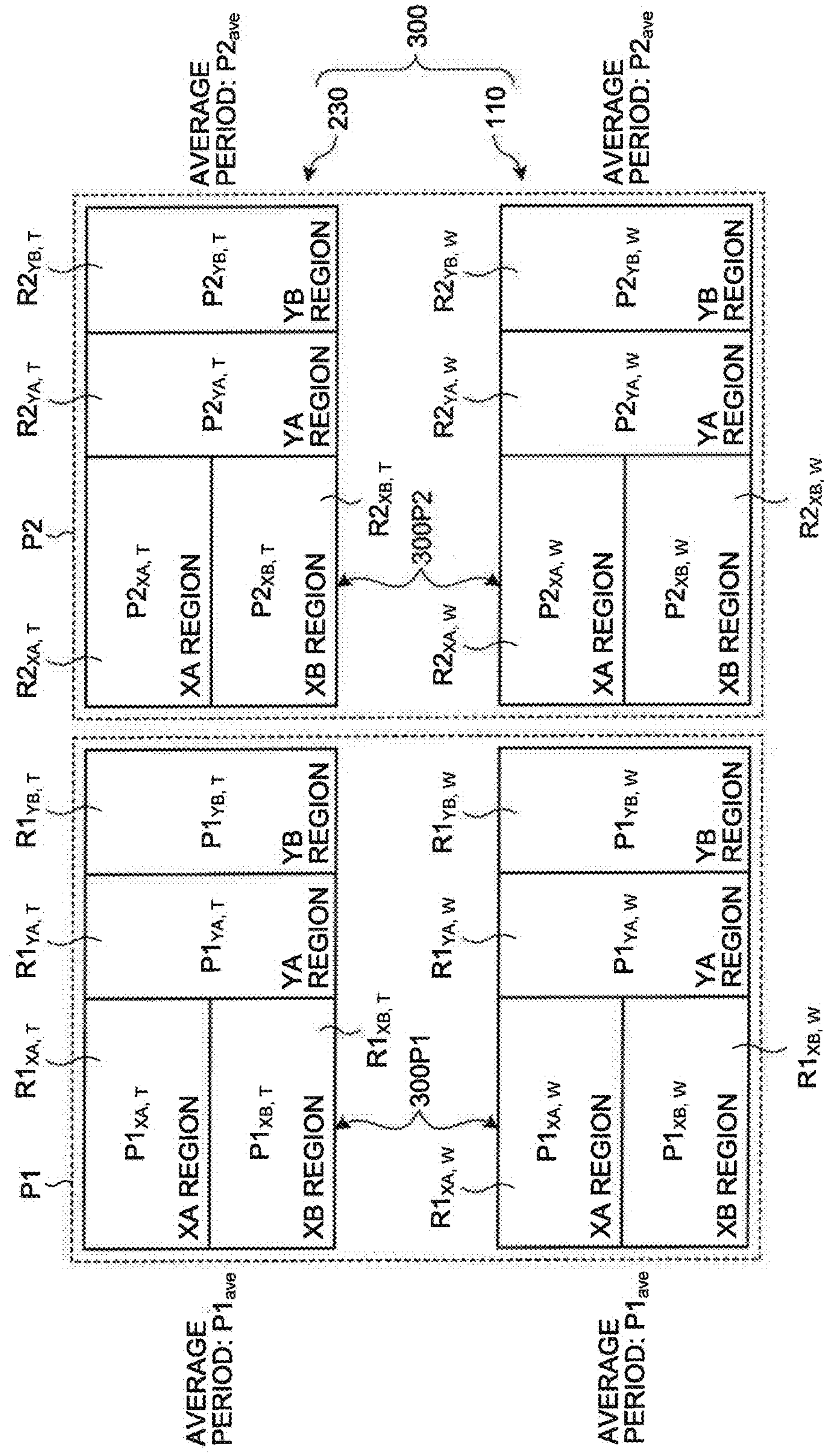
FIG. 6 is a diagram schematically illustrating a configuration example of a moire mark according to a first embodiment.

FIG. 6 is a diagram schematically illustrating a configuration example of a moire mark according to the first embodiment. In the first embodiment, a moire mark 300 includes two combinations of alignment marks 230 and 110 on the template 200 side and wafer 100 side, which are different in average period $P_{ave}$ from each other. Hereinafter, the respective two combinations will be referred to as "first structure P1" and "second structure P2".

Again, FIG. 6 illustrates an example of a moire mark 300 that can perform positioning without necessitating a reference position. Here, the moire mark 300 includes an A region and a B region as two regions adjacent to each other, which are designed to cause their moire images to move in directions opposite to each other in positioning, i.e., to perform differential detection. The first structure P1 and the second structure P2 respectively include XA regions $R1_{XA,T}$ and $R2_{XA,T}$, XA regions $R1_{XA,W}$ and $R2_{XA,W}$, XB regions $R1_{XB,T}$ and $R2_{XB,T}$, XB regions $R1_{XB,W}$ and $R2_{XB,W}$, YA regions $R1_{YA,T}$ and $R2_{YA,T}$, YA regions $R1_{YA,W}$ and $R2_{YA,W}$, YB regions $R1_{YB,T}$ and $R2_{YB,T}$, and YB regions $R1_{YB,W}$ and $R2_{YB,W}$.

The structural periods of the alignment marks 230 arranged in respective ones of the XA region $R1_{XA,T}$, the XB region $R1_{XB,T}$, the YA region $R1_{YA,T}$, and the YB region $R1_{YB,T}$ of the template 200, which have the first structure P1, are denoted by $P1_{XA,T}$, $P1_{XB,T}$, $P1_{YA,T}$, and $P1_{YB,T}$, respectively. Further, the structural periods of the alignment marks 110 arranged in respective ones of the XA region $R1_{XA,W}$, the XB region $R1_{XB,W}$, the YA region $R1_{YA,W}$, and the YB region $R1_{YB,W}$ of the wafer 100, which have the first structure P1, are denoted by $P1_{XA,W}$, $P1_{XB,W}$, $P1_{YA,W}$, and $P1_{YB,W}$, respectively.

The structural periods of the alignment marks 230 arranged in respective ones of the XA region $R2_{XA,T}$, the XB region $R2_{XB,T}$, the YA region $R2_{YA,T}$, and the YB region $R2_{YB,T}$ of the template 200, which have the second structure P2, are denoted by $P2_{XA,T}$, $P2_{XB,T}$, $P2_{YA,T}$, and $P2_{YB,T}$, respectively. Further, the structural periods of the alignment marks 110 arranged in respective ones of the XA region $R2_{XA,W}$, the XB region $R2_{XB,W}$, the YA region $R2_{YA,W}$, and the YB region $R2_{YB,W}$ of the wafer 100, which have the second structure P2, are denoted by $P2_{XA,W}$, $P2_{XB,W}$, $P2_{YA,W}$, and $P2_{YB,W}$, respectively.

The average periods of the structural periods of the respective moire marks 300 having the first structure P1 and second structure P2 are denoted by $P1_{ave}$ and $P2_{ave}$, respectively. Further, the relation with the initial error derived from the rough detection is assumed as follows: Where each of the alignment marks is composed of a one-dimensional pattern, the relation is expressed by the following formula (6). On the other hand, where one of the alignment marks is composed of a checkered pattern, the relation is expressed by the following formula (7).

$$2\Delta x < P2_{ave} \tag{6}$$

$$4\Delta x < P2_{ave} \tag{7}$$

Further, the periodic difference between the alignment marks 230 and 110 having the first structure P1 on the template 200 side and wafer 100 side is denoted by ΔP1, and the periodic difference between the alignment marks 230 and 110 having the second structure P2 on the template 200 side and wafer 100 side is denoted by ΔP2. In this case, the lower limits of the size sizes L1 and L2 of the respective moire marks 300 having the first structure P1 and second structure P2 are defined by the following formulas (8) and (9), respectively, on the basis of the formula (5).

$$L1 = NC\frac{P1_{ave}^2}{\Delta P1} \tag{8}$$

$$L2 = NC\frac{P2_{ave}^2}{\Delta P2} \tag{9}$$

Here, consideration will be given of a case to obtain capability equivalent to that of the moire mark according to the comparative example having the average period $P_{ave}$ and the periodic difference ΔP. For example, it is assumed that the first structure P1 has relations of $P1_{ave}=P_{ave}/2$ and $\Delta P1=\Delta P/2$, and the second structure P2 has relations of $P2_{ave}=P_{ave}$ and $\Delta P2=2\Delta P$.

In the comparative example, the initial error caused by the rough detection can be absorbed if the relation of $\Delta x<\Delta P/2$ is satisfied. In this respect, in the first structure P1 of FIG. 6, the initial error caused by the rough detection cannot be absorbed because $\Delta x<\Delta P1$ holds. However, as the periodic difference ΔP1 of the first structure P1 is half the periodic difference ΔP of the comparative example, the positional accuracy becomes higher than that of the comparative example. On the other hand, in the second structure P2 of FIG. 6, the initial error caused by the rough detection can be absorbed because $\Delta x<\Delta P2/4$ holds. However, as the periodic difference ΔP2 of the second structure P2 is twice the periodic difference ΔP of the comparative example, the positional accuracy becomes lower than that of the comparative example. As described above, the first structure P1 can be utilized for positioning with high positional accuracy, and the second structure P2 can absorb the initial error. Thus, the moire mark 300P1 having the first structure P1 can be used as a mark for high accuracy, and the moire mark 300P2 having the second structure P2 can be used as a mark for middle accuracy. Accordingly, by using two mark sets, it is possible to achieve sustainment of the positional accuracy, and absorption of the initial error. Here, the high accuracy and the middle accuracy are relative expressions with respect to a case where low accuracy is defined by positioning performed by rough detection marks.

Further, the sizes L1 and L2 of the moire marks 300P1 and 300P2 having the first structure P1 and second structure P2 satisfy $L1=L2=L/2$, on the basis of the formulas (8) and (9). Accordingly, the areas of the first structure P1 and second structure P2 satisfy $L1^2=L2^2=L^2/4$, and the total area of the moire marks 300P1 and 300P2 having the first structure P1 and second structure P2 come to be expressed by $L^2/4\times2=L^2/2$. Thus, in the case of $2P1_{ave}=P2_{ave}$, the total area is half the area of the moire mark according to the comparative example.

In the example described above, $2P1_{ave}=P2_{ave}$ holds; however, in order to retain the areal superiority over the comparative example, it is necessary to satisfy the following formula (10).

$$L1^2+L2^2\leq L^2 \tag{10}$$

Where $P1_{ave}$ and $P2_{ave}$ satisfy the relation of the following formula (11), the area of the moire mark 300 becomes equal to the area of the comparative example.

$$\sqrt{2}P1_{ave}=P2_{ave} \tag{11}$$

Accordingly, in order to retain the areal superiority over the comparative example, $P1_{ave}$ and $P2_{ave}$ satisfy the relation of the following formula (12).

$$\sqrt{2}P1_{ave}\leq P2_{ave} \tag{12}$$

Figure 7A:
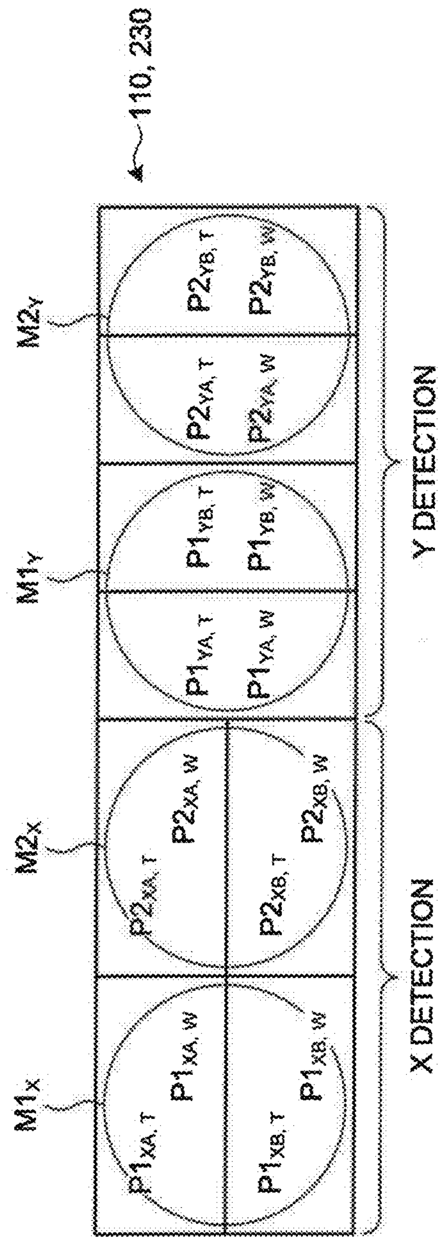
FIGS. 7A and 7B are diagrams schematically illustrating other examples of arrangement of alignment marks according to the first embodiment.
Figure 7B:
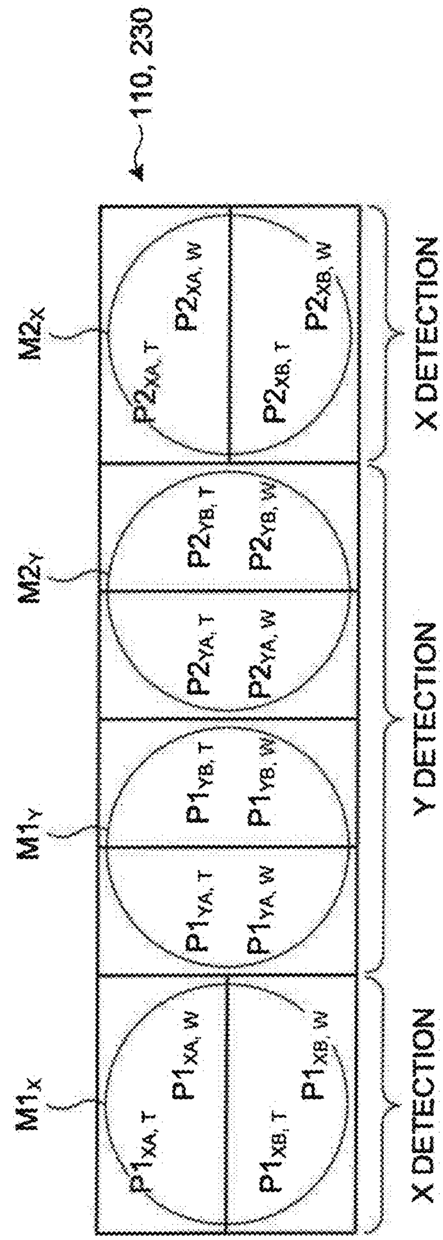

Here, in the first embodiment, it is sufficient if the A region and the B region in each of the first structure P1 and the second structure P2 are arranged adjacent to each other; thus, the other arrangement can be set in any arrangement. FIGS. 7A and 7B are diagrams schematically illustrating other examples of arrangement of alignment marks according to the first embodiment. Here, as the alignment marks 230 and 110 on the template 200 side and wafer 100 side are set in the same arrangement, FIGS. 7A and 7B illustrate the alignment marks 230 and 110 together in one block. In FIG.

6, the marks constituting the first structure P1 are arranged together in one region, the marks constituting the second structure P2 are arranged together in one region, and the respective regions are arranged adjacent to each other.

On the other hand, in FIG. 7A, marks $M1_X$ and $M1_Y$ constituting the first structure P1 and marks $M2_X$ and $M2_Y$ constituting the second structure P2 are arranged intricate with each other. The mark $M1_X$ having the first structure P1 and the mark $M2_X$ having the second structure P2, for detecting displacement in the X-direction, are arranged adjacent to each other in the X-direction. The mark $M1_Y$ having the first structure P1 and the mark $M2_Y$ having the second structure P2, for detecting displacement in the Y-direction, are arranged adjacent to each other in the Y-direction. In other words, the mark $M1_X$ and $M2_X$ for detecting displacement in the X-direction are arranged together in one region, the marks $M1_Y$ and $M2_Y$ for detecting displacement in the Y-direction are arranged together in one region, and the respective regions are arranged adjacent to each other in the X-direction.

Further, in FIG. 7B, marks $M1_X$ and $M1_Y$ constituting the first structure P1 and marks $M2_X$ and $M2_Y$ constituting the second structure P2 are arranged adjacent to each other. However, the arrangement among the respective marks is different. Specifically, the marks $M1_Y$ and $M2_Y$ having the first structure P1 and second structure P2, for detecting displacement in the Y-direction, are interposed between the mark $M1_X$ having the first structure P1, for detecting displacement in the X-direction, and the mark $M2_X$ having the second structure P2, for detecting displacement in the X-direction.

As described above, the alignment mark 230 on the template 200 side is arranged in the mark arrangement region $R_M$, and the alignment mark 110 on the wafer 100 side is arranged in each Kerf region $R_K$. If a collective alignment mark arrangement area can not be ensured in each of the mark arrangement region $R_M$ and Kerf region $R_K$, it may be adopted that marks having the first structure P1 and second structure P2, for detecting displacement in the X-direction, are arranged in a first region in each of the mark arrangement region $R_M$ and Kerf region $R_K$, and marks having the first structure P1 and second structure P2, for detecting displacement in the Y-direction, are arranged in a second region other than the first region in each of the mark arrangement region $R_M$ and Kerf region $R_K$, for example. In this way, the moire mark 300 according to the first embodiment is higher in arrangement flexibility.

Figure 8A:
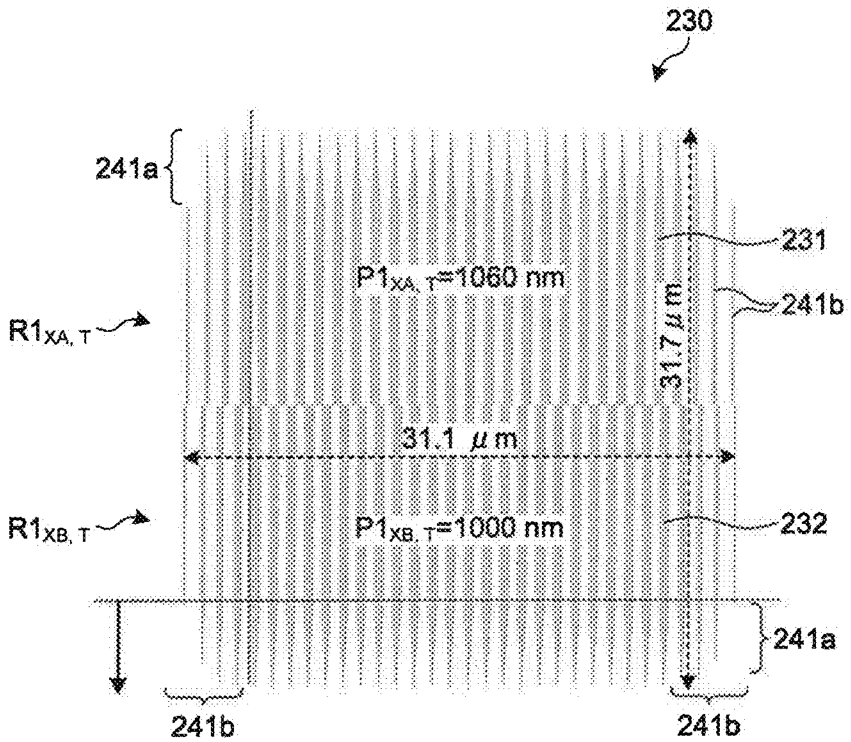
FIGS. 8A and 8B are top views schematically illustrating a structural example of a moire mark having a first structure according to the first embodiment.
Figure 8B:
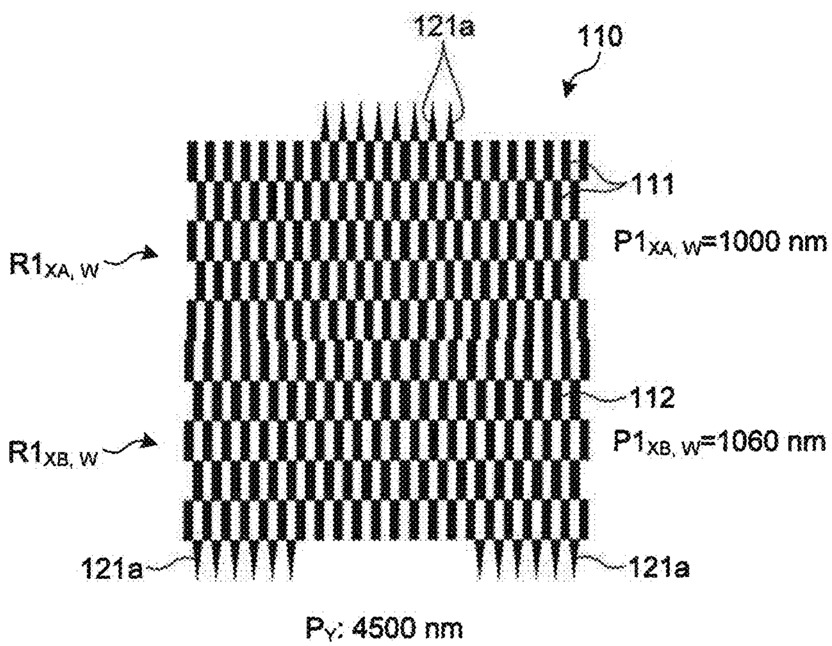
Figure 9A:
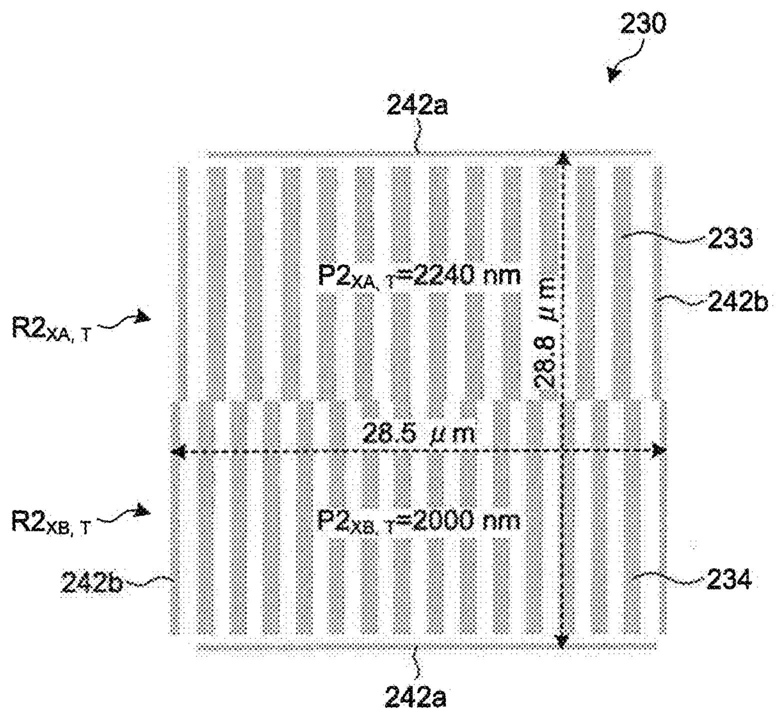
FIGS. 9A and 9B are top views schematically illustrating a structural example of a moire mark having a second structure according to the first embodiment.
Figure 9B:
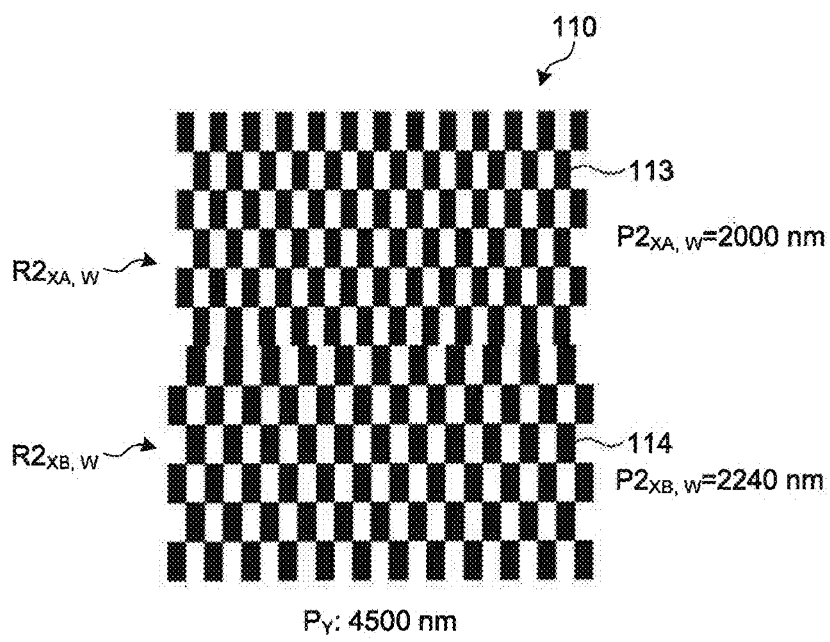

Here, an explanation will be given of an example of a moire image to be formed by the moire mark 300. As illustrated in FIG. 6, it is assumed that marks having the first structure P1 and second structure P2 are arranged. FIGS. 8A and 8B are top views schematically illustrating a structural example of a moire mark having the first structure according to the first embodiment. FIG. 8A illustrates an example of a template-side alignment mark. FIG. 8B illustrates an example of a wafer-side alignment mark. FIGS. 9A and 9B are top views schematically illustrating a structural example of a moire mark having the second structure according to the first embodiment. FIG. 9A illustrates an example of a template-side alignment mark. FIG. 9B illustrates an example of a wafer-side alignment mark.

Each alignment mark 230 on the template 200 side is composed of a line-and-space pattern, in which one-dimensional line patterns 231 and 232 or 233 and 234 are arranged in parallel with each other. Each alignment mark 110 on the wafer 100 side is composed of a checkered pattern. These alignment marks 230 and 110 are used to detect displacement in the X-direction or Y-direction. Here, FIGS. 8A, 8B, 9A, and 9B illustrate alignment marks 230 and 110 for detecting displacement in the X-direction. The alignment marks 230 and 110 for detecting displacement in the Y-direction are obtained by rotating the marks illustrated in FIGS. 8A, 8B, 9A, and 9B by 90° on the drawing sheet plane. Further, the first structure P1 is provided with A regions $R1_{XA,T}$ and $R1_{XA,W}$ and B regions $R1_{XB,T}$ and $R1_{XB,W}$ for performing differential detection. The periods of periodic patterns formed in the respective regions are as follows:

$$P1_{XA,T}=P1_{XB,W}=P1_{YA,T}=P1_{YB,W}=1{,}060\text{ nm}$$

$$P1_{XA,W}=P1_{XB,T}=P1_{YA,W}=P1_{YB,T}=1{,}000\text{ nm}$$

The second structure P2 is also provided with A regions $R2_{XA,T}$ and $R2_{XA,W}$ and B regions $R2_{XB,T}$ and $R2_{XB,W}$ for performing differential detection. The periods of periodic patterns formed in the respective regions are as follows:

$$P2_{XA,T}=P2_{XB,W}=P2_{YA,T}=P2_{YB,W}=2{,}240\text{ nm}$$

$$P2_{XA,W}=P2_{XB,T}=P2_{YA,W}=P2_{YB,T}=2{,}000\text{ nm}$$

In the above configuration, the average period $P1_{ave}$ of the first structure P1 is 1,030 nm, and the periodic difference ΔP1 between the alignment marks 230 and 110 on the template 200 side and wafer 100 side is 60 nm. Each of the periods of periodic patterns constituting the first structure P1 falls within a range of 10% or less from the average period $P1_{ave}$. Further, the average period $P2_{ave}$ of the second structure P2 is 2,120 nm, and the periodic difference ΔP2 between the alignment marks 230 and 110 on the template 200 side and wafer 100 side is 240 nm. Each of the periods of periodic patterns constituting the second structure P2 falls within a range of 10% or less from the average period $P2_{ave}$.

Here, the vertical direction period of the checkered pattern (the period in the direction orthogonal to the structural period of the alignment mark 230 on the template 200 side) is 4,500 nm. Further, noise cancelling patterns 241*a*, 241*b*, 242*a*, 242*b*, and 121*a* are provided around the line patterns 231 and 232 for the first structure P1 and the line patterns 233 and 234 for the second structure P2 in the template 200, and around rectangular patterns 111 and 112 for the first structure P1 in the wafer 100. In this example, it is premised that a dark field optical system is used to perform moire image monitoring; therefore, the noise cancelling patterns 241*a*, 241*b*, 242*a*, 242*b*, and 121*a* are provided to suppress scattered light (noise) to be generated at portions where the period structures break off. The shape and arrangement position of each of the noise cancelling patterns 241*a*, 241*b*, 242*a*, 242*b*, and 121*a* vary depending on the size and/or structure of the moire mark 300.

For example, as illustrated in FIG. 8A, the alignment mark 230 having the first structure P1 on the template 200 side is provided with noise cancelling patterns 241*a*, which are arranged at the extending direction ends of the respective line patterns 231 and 232 constituting the alignment mark 230 and are tapered toward their tips. Further, this mark is provided with a plurality of cancelling patterns 241*b*, which are arranged at the array direction ends of the line patterns 231 and 232 constituting the alignment mark 230 and are shorter than the line patterns 231 and 232. Further, as illustrated in FIG. 8B, the alignment mark 110 having the first structure P1 on the wafer 100 side is provided with noise cancelling patterns 121*a*, which are arranged at some of the ends in a direction perpendicular to the displacement detection direction and are tapered toward their tips.

As illustrated in FIG. 9A, the alignment mark 230 having the second structure P2 on the template 200 side is provided with noise cancelling patterns 242*a*, which are arranged along the displacement detection direction with a predetermined distance from the extending direction ends and are in the form of a line thinner than the line patterns 233 and 234 constituting the alignment mark 230. Further, this mark is provided with noise cancelling patterns 242*b*, which are arranged along the extending direction at the displacement detection direction ends and are in the form of a line thinner than the line patterns 233 and 234 constituting the alignment mark 230.

The overall size of the moire mark 300 described above is 126 μm x 32 μm, which includes the noise cancelling patterns 241*a*, 241*b*, 242*a*, 242*b*, and 121*a*. On the other hand, a moire mark according to the scheme of the comparative example and having capability equivalent to that of the moire mark 300 described above comes to be about 120 μm×60 μm. Thus, the moire mark 300 according to the first embodiment has an area about half that of the moire mark according to the scheme of the comparative example and having capability equivalent thereto.

Figure 10A:
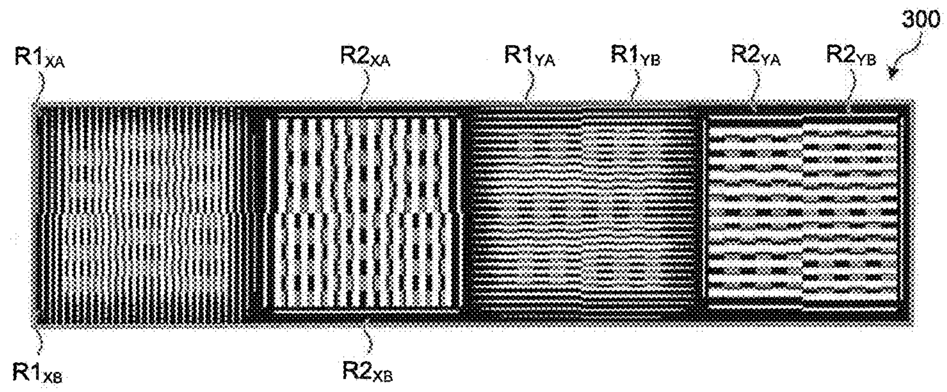
FIGS. 10A and 10B are diagrams illustrating an example of moire images obtained by moire marks.
Figure 10B:
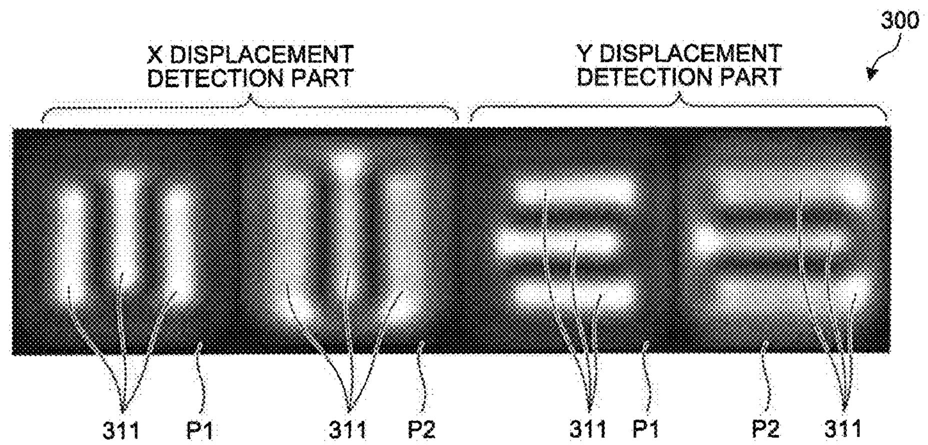

FIGS. 10A and 10B are diagrams illustrating an example of moire images obtained by moire marks. FIG. 10A is a diagram illustrating an example of a state where the alignment marks of FIGS. 8A and 9A are overlaid with each other and the alignment marks of FIGS. 8B and 9B are overlaid with each other (in both of the X- and Y-directions). FIG. 10B is a diagram illustrating an example of a simulation result of moire that appear when the moire marks of FIGS. 8A, 8B, 9A, and 9B are used (in both of the X- and Y-directions). In FIG. 10A, moire patterns having periods larger than the structural periods of the alignment marks are illustrated. Further, in FIG. 10B, white line portions correspond to ridges 311 of the moire images, and a state is illustrated where three ridges 311 are included in each of the regions having the first structure P1 and second structure P2. Further, in FIG. 10B, each of the regions having the first structure P1 and second structure P2 has no deviation at the boundary between the A region and the B region, and thus a state is illustrated where positioning has been precisely performed by using the moire marks.

In FIG. 10B, the moire images obtained by the marks having the first structure P1 is more clearly seen, as compared with the moire images obtained by the marks having the second structure P2. Accordingly, positioning with high accuracy can be performed by using the marks having the first structure P1. On the other hand, as described above, the marks having the second structure P2 are configured to absorb the initial error caused by the rough detection. As these moire marks 300 are employed, when the initial error derived from the rough detection needs to be absorbed, the marks having the second structure P2 can be used to perform positioning with middle accuracy higher in accuracy than the rough detection, and, thereafter, the marks having the first structure P1 can be used to perform positioning with higher accuracy.

Figure 11:
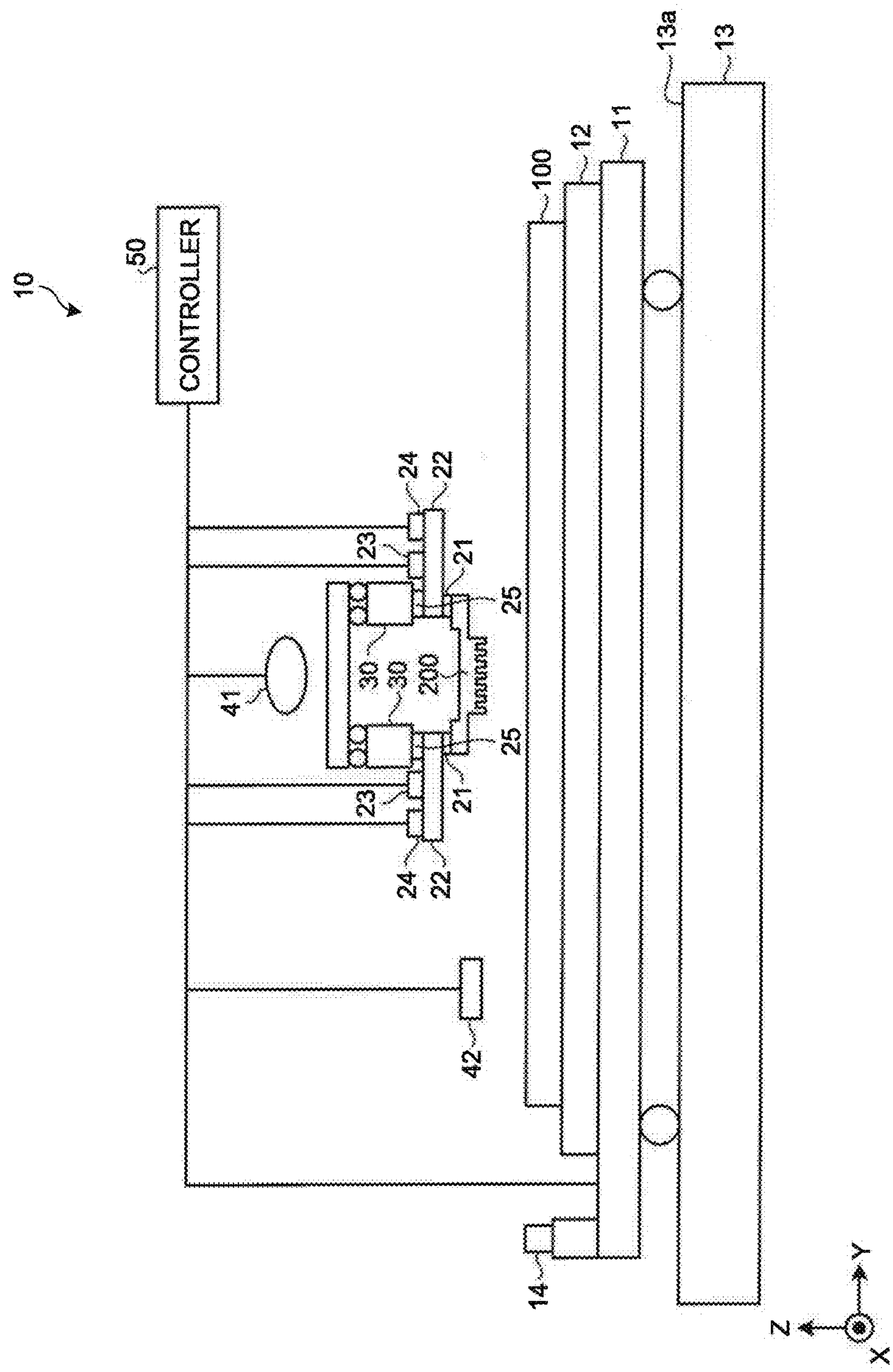
FIG. 11 is a sectional view schematically illustrating an example of an imprint apparatus according to the first embodiment.

Next, an explanation will be given of an imprint apparatus for executing an imprint process that performs positioning by using the template 200 and the wafer 100, which include the moire mark 300 described above. FIG. 11 is a sectional view schematically illustrating an example of an imprint apparatus according to the first embodiment. The imprint apparatus 10 includes a substrate stage 11. The substrate stage 11 is provided with a chuck 12. The chuck 12 is configured to hold the wafer 100 treated as a pattern formation object. The chuck 12 holds the wafer 100 by means of, for example, vacuum suction. A processing object holder includes the substrate stage 11 and the chuck 12.

The wafer 100 includes a substrate, such as a semiconductor substrate, an underlying pattern formed on this substrate, and a processing target layer formed on this underlying pattern. When pattern transfer is performed, the wafer 100 further includes a resist formed on the processing target layer. As the processing target layer, an insulating film, metal film (conductive film), or semiconductor film may be cited.

The substrate stage 11 is provided to be movable on a stage bed 13. The substrate stage 11 is arranged to be movable along respective ones of two axes that extend along the upper surface 13*a* of the stage bed 13. Here, the two axes that extend along the upper surface 13*a* of the stage bed 13 will be referred to as "X-axis" and "Y-axis". The substrate stage 11 is further arranged to be movable in the height direction that will be referred to as "Z-axis", which is orthogonal to the X-axis and the Y-axis. The substrate stage 11 is preferably arranged to be rotatable about each of the X-axis, the Y-axis, and the Z-axis.

The substrate stage 11 is provided with a reference mark pedestal 14. A reference mark (not illustrated) is disposed at the top of the reference mark pedestal 14, and is used as a reference position for the imprint apparatus 10. For example, the reference mark is composed of a diffraction grating having a checkered pattern. The reference mark is used for performing calibration of alignment scopes 30 and positioning (attitude control and adjustment) of the template 200. The reference mark serves as the original point on the substrate stage 11. The X- and Y-coordinates of the wafer 100 placed on the substrate stage 11 are coordinates using the reference mark pedestal 14 as the original point.

The imprint apparatus 10 includes a template stage 21. The template stage 21 is configured to fix the template 200. The template stage 21 holds the peripheral portion of the template 200 by means of, for example, vacuum suction. The template stage 21 operates to position the template 200 with reference to the apparatus. The template stage 21 is attached to a base part 22.

A correction mechanism 23 and a pressurizing section 24 are mounted on the base part 22. The correction mechanism 23 includes an adjustment mechanism for slightly adjusting the position (attitude) of the template 200 in accordance with an instruction received from, for example, a controller 50. With this adjustment, the relative positions of the template 200 and the wafer 100 therebetween are corrected.

The pressurizing section 24 applies stress to the side surfaces of the template 200 to straighten distortion of the template 200. The pressurizing section 24 applies pressure to the template 200 from the four side surfaces of the template 200 toward the center. With this pressure application, the dimensions of a pattern to be transferred are corrected (magnification correction). The pressurizing section 24 applies pressure to the template 200 by a predetermined stress in accordance with an instruction received from, for example, the controller 50.

The base part 22 is attached to the alignment stage 25. The alignment stage 25 moves the base part 22 in the X-axis direction and the Y-axis direction to perform positioning between the template 200 and the wafer 100. The alignment stage 25 also has a function to rotate the base part 22 along an XY-plane. The rotational direction along the XY-plane will be referred to as "θ-direction". Here, a template holder includes the template stage 21, and may further include the base part 22, the correction mechanism 23, the pressurizing section 24, and the alignment stage 25 in addition.

Each of the alignment scopes 30 serves as an optical monitoring unit for detecting alignment marks provided on the template 200 and alignment marks provided on the wafer 100. The alignment marks on the wafer 100 and the alignment marks on the template 200 are used to measure relative positional deviation between the template 200 and the wafer 100. Here, the respective alignment scopes 30 are preferably arranged at positions corresponding to the four corners of the mesa part 211 of the template 200, to simultaneously pick up images of the alignment marks arranged at the four corners of the mesa part 211.

The imprint apparatus 10 includes a light source 41 and a coating member 42. The light source 41 emits electromagnetic waves, for example, within the ultraviolet region. The light source 41 is arranged to be right above the template 200, for example. In another case, the light source 41 may be not arranged right above the template 200. In this case, an optical path is set by using an optical component, such as a mirror, so that light emitted from the light source 41 can be radiated from right above the template 200 toward the template 200. The light source 41 turns on or off the light irradiation to the template 200 in accordance with an instruction received from, for example, the controller 50.

The coating member 42 is a member for applying a resist onto the wafer 100. For example, the coating member 42 is formed of an inkjet head including a nozzle, and is configured to drop the resist from the nozzle onto the wafer 100. The resist used in the first embodiment may have a refractive index equivalent to the refractive index of the template 200. It should be noted that the "equivalent to" used here encompasses not only a state completely equal to each other but also a state slightly different from each other. The coating member 42 drops the resist onto a predetermined position on the wafer 100 in accordance with an instruction received from, for example, the controller 50.

The imprint apparatus 10 includes the controller 50. The controller 50 conducts overall control of the imprint apparatus 10. For example, the controller 50 executes a control process for the substrate stage 11, a control process for the light source 41, a positional deviation correcting process, a template height arithmetic process, a magnification correcting process, and so forth, in accordance with programs prescribing the contents of the respective processes.

The control process for the substrate stage 11 is a process of generating a signal for controlling the substrate stage 11 in the X-axis direction, the Y-axis direction, the Z-axis direction, and the θ-direction. With this process, the relative positions of the template 200 and the substrate stage 11 therebetween are controlled. The control process for the light source 41 is a process of controlling the light irradiation timing or irradiation amount used by the light source 41 when the resist is cured.

In the positional deviation correcting process, the alignment marks on the template 200, and the reference mark on the reference mark pedestal 14 or the alignment marks on the wafer 100 are used, to obtain a positional deviation of the template 200 relative to the reference mark, and to obtain a positional deviation of the wafer 100 relative to the template 200. Then, on the basis of these positional deviations, an arithmetic operation for achieving alignment between the template stage 21 and the substrate stage 11 is performed, and the positional deviations are thereby corrected.

In the template height arithmetic process, the alignment marks on the template 200, and the alignment marks on the wafer 100 or the reference mark on the reference mark pedestal 14 are used, to perform an arithmetic operation for calculating the template height at the alignment mark formation position of the template 200.

In the magnification correcting process, a predetermined arithmetic operation is performed on the basis of the template height, to calculate a stress for performing magnification correction to the template 200. Then, a signal for generating this stress is given to the pressurizing section 24.

Figure 12:
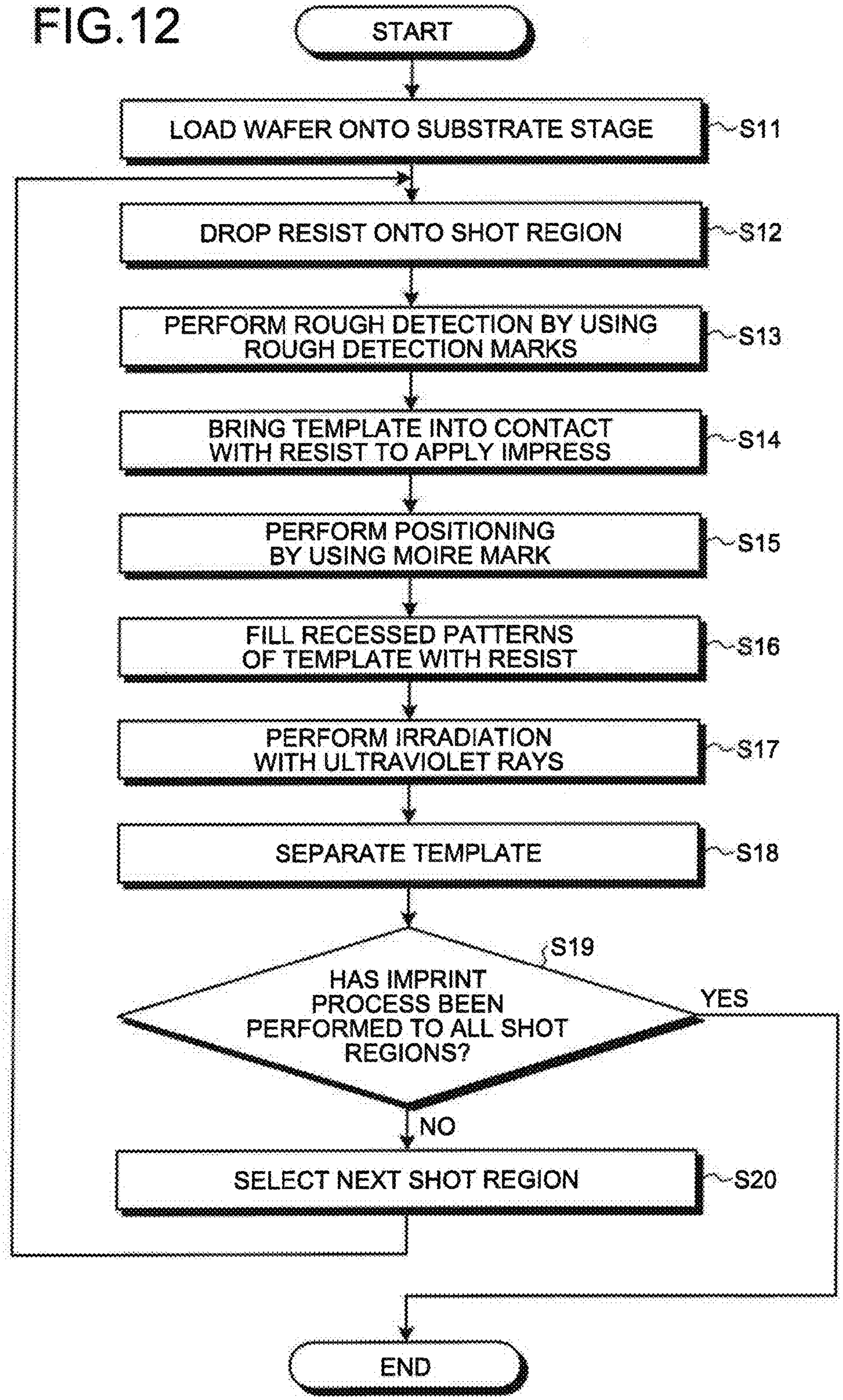
FIG. 12 is a flowchart illustrating an example of the sequence of an imprint method according to the first embodiment.

Next, an explanation will be given of an imprint method including an alignment process between the template 200 and the wafer 100 in the imprint apparatus 10 described above. FIG. 12 is a flowchart illustrating an example of the sequence of an imprint method according to the first embodiment. Here, the controller 50 controls operations of the respective components of the imprint apparatus 10 in accordance with the flowchart described below.

First, the wafer 100 is loaded onto the substrate stage 11 of the imprint apparatus 10 (step S11). Then, a resist is dropped from the coating member 42 onto a shot region $R_S$ to be processed of the wafer 100 (step S12). Thereafter, rough detection is performed by using rough detection marks on the template 200 side and wafer 100 side (step S13). The rough detection is coarse positioning performed before the template 200 is brought closer to the wafer 100. The positional accuracy of this rough detection is Δx, and positioning error between the template 200 and the wafer 100 is Δx or less.

Thereafter, the template 200 is moved down and brought into contact with the resist on the wafer 100 to apply an impress (step S14). Further, in this impress process to the resist, a positioning process between the template 200 and the wafer 100 is performed by using the moire mark (step S15). In this positioning process, under monitoring by the alignment scopes 30, positioning with middle accuracy is performed by using the marks having the second structure P2 of the moire mark 300, and then positioning with higher accuracy is performed by using the marks having the first structure P1.

Specifically, in a state where the illumination (not illustrated) of the alignment scopes 30 is lit up, the alignment mark of a pattern of lines in the mark arrangement region $R_M$ of the template 200 is brought to be overlaid with the alignment mark of a checkered pattern in a Kerf region $R_K$ of the wafer 100. At this time, as the period of the alignment mark 110 on the wafer 100 is slightly different from the period of the alignment mark 230 of the template 200, a moire image is generated. The position of brightness bands in this moire reflects the positional deviation of the template 200 relative to the wafer 100 in an enlarged state. Accordingly, when the template 200 moves slightly with respect to the wafer 100, the position of brightness bands in the moire moves significantly. Thus, by utilizing the position of brightness bands in the moire it is possible to precisely adjust the position of the template 200 in the X-direction or Y-direction with respect to the wafer 100. Here, this positioning is performed for each of the X-direction and the Y-direction.

In the positioning utilizing the moire, even if the template 200 is deviated from the wafer 100 by one or more periods of the pattern, the deviation cannot be detected. However, in the rough detection, the positional deviation of the template 200 relative to the wafer 100 is set to be less than one period of the pattern. Thus, in the precise positioning utilizing the moire, there is no need to consider the possibility of the deviation being one or more periods.

Thereafter, the template 200 is kept in a state in contact with the resist for a predetermined time, so that the recessed patterns of the template 200 are filled with the resist (step S16). Then, the resist pattern is irradiated with ultraviolet rays through the template 200 (step S17). Consequently, the resist pattern is cured.

Thereafter, the template 200 is separated from the wafer 100 and the resist pattern (step S18). Then, it is determined whether the imprint process has been performed to all the shot regions $R_S$ on the wafer 100 (step S19). When the imprint process has not yet been performed to all the shot regions $R_S$ (No at step S19), a next shot region $R_S$ is selected (step S20), and the process sequence goes back to step S12. On the other hand, when the imprint process has been performed to all the shot regions $R_S$ (Yes at step S19), the imprint method ends.

After the imprint process is performed to all the shot regions $R_S$, a subsequent process, for example, an etching process, such as a Reactive Ion Etching (RIE) method, is performed, on the basis of the resist pattern formed by the imprint process. The processes described above are repeated to manufacture semiconductor devices.

Figure 13A:
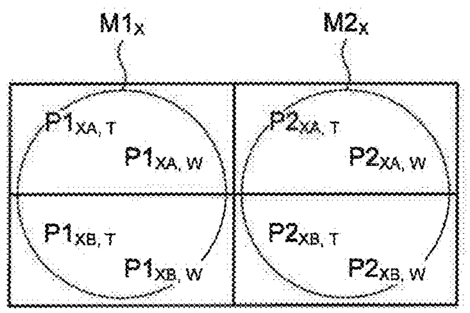
FIGS. 13A and 13B are diagrams illustrating other examples of arrangement of moire marks according to the first embodiment.
Figure 13B:
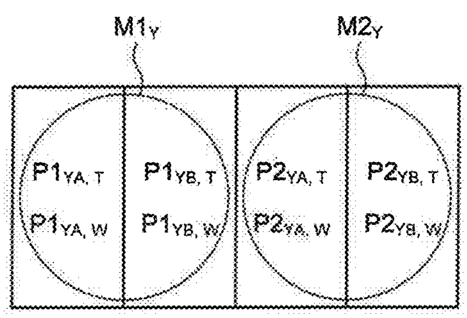

In the above description, a case is illustrated where one moire mark 300 includes alignment marks 230 and 110 for detecting displacement in the X-direction, and alignment marks 230 and 110 for detecting displacement in the Y-direction; however, the embodiment is not limited to this. FIGS. 13A and 13B are diagrams illustrating other examples of arrangement of moire marks according to the first embodiment. FIG. 13A is a diagram illustrating an example of arrangement of a moire mark including only alignment marks for detecting displacement in the X-direction. FIG. 13B is a diagram illustrating an example of arrangement of a moire mark including only alignment marks for detecting displacement in the Y-direction. Here, again, as the alignment marks 230 and 110 on the template 200 side and wafer 100 side are set in the same arrangement, also FIGS. 13A and 13B illustrate the alignment marks 230 and 110 together in one block. In FIG. 13A, only marks $M1_X$ and $M2_X$ for detecting displacement in the X-direction are arranged in one region. Further, in FIG. 13B, only marks $M1_Y$ and $M2_Y$ for detecting displacement in the Y-direction are arranged in one region.

The mark arrangement region $R_M$ of the template 200 and each Kerf region $R_K$ of the wafer 100 may be provided with the marks $M1_X$ and $M2_X$ including only alignment marks for detecting displacement in the X-direction, or the marks $M1_Y$ and $M2_Y$ including only alignment marks for detecting displacement in the Y-direction. With this arrangement of moire marks, it is possible to detect distortion of the template 200 from results of positional deviation at respective positions.

In the first embodiment, the moire mark 300 is used in which the alignment mark 230 and the alignment mark 110 are arranged to be overlaid with each other. The alignment mark 230 has a periodic structure and is provided on the template 200. The alignment mark 110 has a periodic structure and is provided on the wafer 10, which is to be placed to face the template 200. The moire mark 300 includes the first structure P1 having an average period $P1_{ave}$ and the second structure P2 having an average period $P2_{ave}$, which are set to satisfy the formula (12). Further, the moire mark 300 is set such that the relation with the initial error derived from the rough detection is as follows: Where each of the alignment marks is composed of a one-dimensional pattern, one of the alignment marks satisfies the formula (6). Where one of the alignment marks is composed of a checkered pattern, one of the alignment marks satisfies the formula (7). Consequently, it is possible to provide a moire mark 300 smaller in area as compared with the moire mark according to the comparative example, while sustaining positioning accuracy equivalent to that of the moire mark according to the comparative example.

Further, the alignment marks constituting each of the first structure P1 and the second structure P2 do not need to be arranged together in the mark arrangement region $R_M$ and each Kerf region $R_K$. The alignment marks constituting the first structure P1 and second structure P2 may be arranged intricate with each other. Thus, the arrangement flexibility of the alignment marks becomes higher as compared with the comparative example. As a result, some of the alignment marks can be arranged dividedly into a dead space in the mark arrangement region $R_M$ and each Kerf region $R_K$.

Second Embodiment

In the first embodiment, as seen in the simulation result of FIG. 10B illustrating dark field images, a moire image generated by the A region and a moire image generated by the B region, which are used to perform differential detection, are continuous with each other. In other words, the ridge portions of the moire image of the A region are connected to the ridge portions of the moire image of the B region. Accordingly, it becomes difficult to visually confirm the deviation between the moire images of the A region and B region, as the case may be. In the second embodiment, an explanation will be given of an example in which the moire images of the A region and B region are separated to make it easier to visually confirm the deviation between the moire images of the two regions.

Figure 14:
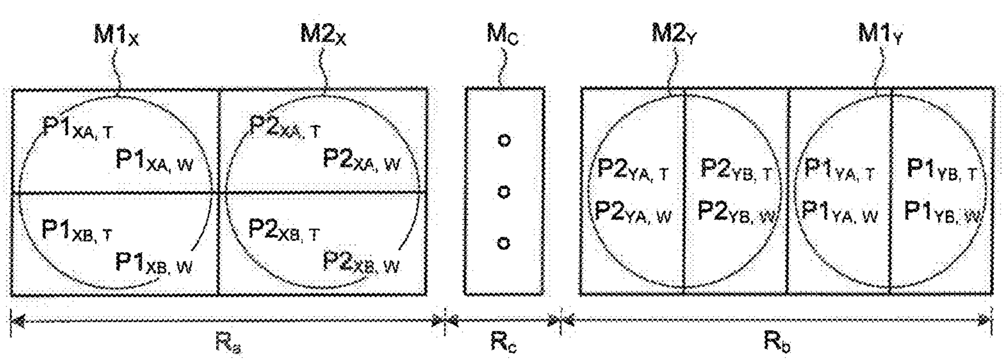
FIG. 14 is a top view illustrating an example of arrangement of alignment marks according to a second embodiment.

FIG. 14 is a top view illustrating an example of arrangement of alignment marks according to the second embodiment. In this example, the alignment marks include marks $M1_X$, $M1_Y$, $M2_X$, and $M2_Y$ having the first structure P1 and second structure P2, and a rough detection mark $M_C$. The marks $M1_X$, $M1_Y$, $M2_X$, and $M2_Y$ having the first structure P1 and second structure P2 are arranged as follows: The marks $M1_X$ and $M2_X$ having the first structure P1 and second structure P2, for detecting displacement in the X-direction, are arranged in a first region $R_a$. The marks $M2_Y$ and $M1_Y$ having the second structure P2 and first structure P1, for detecting displacement in the Y-direction, are arranged in a second region $R_b$. The rough detection mark $M_C$ is arranged in a third region $R_c$ between the first region and the second region.

Figure 15A:
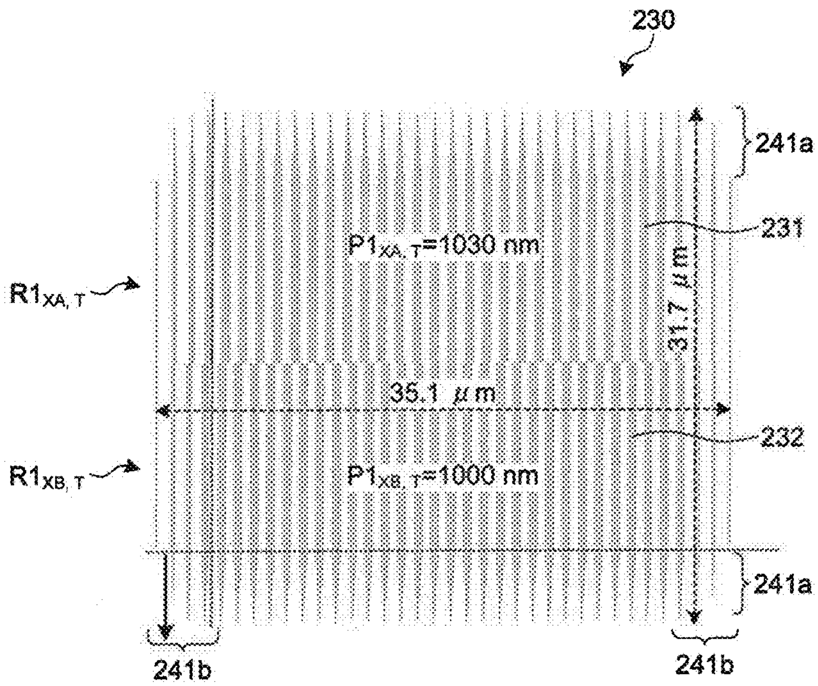
FIGS. 15A and 15B are top views schematically illustrating a structural example of a moire mark having a first structure according to the second embodiment.
Figure 15B:
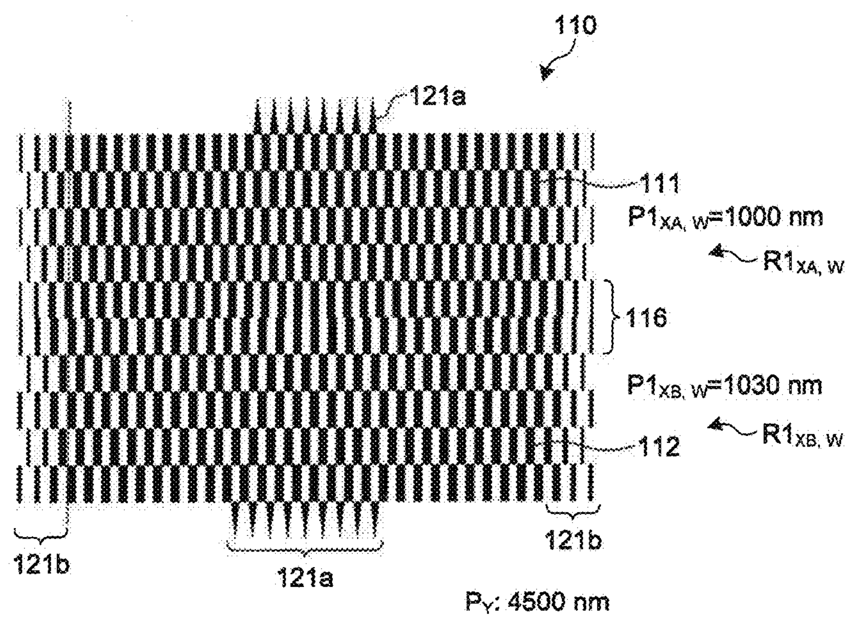
Figure 16A:
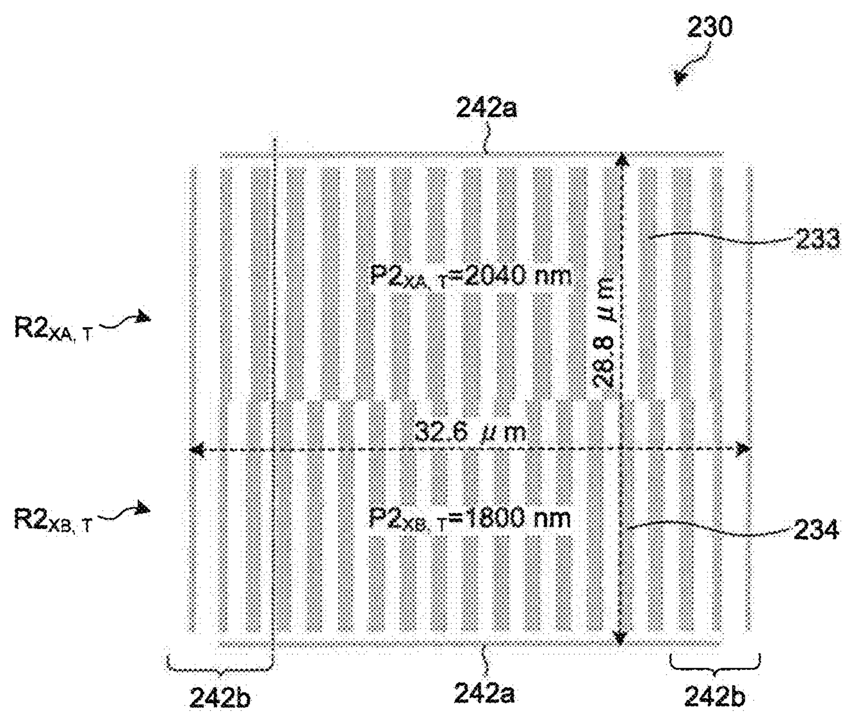
FIGS. 16A and 16B are top views schematically illustrating a structural example of a moire mark having a second structure according to the second embodiment.
Figure 16B:
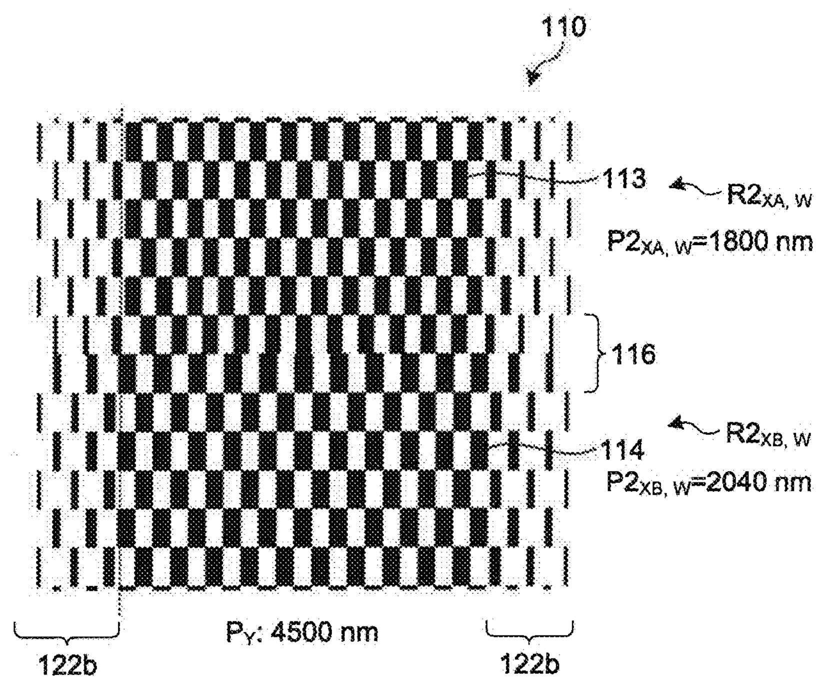

FIGS. 15A and 15B are top views schematically illustrating a structural example of a moire mark having a first structure according to the second embodiment. FIG. 15A illustrates an example of a template-side alignment mark. FIG. 15B illustrates an example of a wafer-side alignment mark. FIGS. 16A and 16B are top views schematically illustrating a structural example of a moire mark having a second structure according to the second embodiment. FIG. 16A illustrates an example of a template-side alignment mark. FIG. 16B illustrates an example of a wafer-side alignment mark.

Each alignment mark 230 on the template 200 side is composed of a line-and-space pattern, in which one-dimensional line patterns 231 and 232 or 233 and 234 are arranged in parallel with each other. Each alignment mark 110 on the wafer 100 side is composed of a checkered pattern, in which rectangular patterns 111 and 112 or 113 and 114 are periodically arranged in a two-dimensional plane. These alignment marks 230 and 110 are used to detect displacement in the X-direction or Y-direction. Here, FIGS. 15A, 15B, 16A, and 16B illustrate alignment marks 230 and 110 for detecting displacement in the X-direction. The alignment marks 230 and 110 for detecting displacement in the Y-direction are obtained by rotating the marks illustrated in FIGS. 15A, 15B, 16A, and 16B by 90° on the drawing sheet plane. Further, the first structure P1 is provided with A regions $R1_{XA,T}$ and $R1_{XA,W}$ and B regions $R1_{XB,T}$ and $R1_{XB,W}$ for performing differential detection. The periods of periodic patterns formed in the respective regions are as follows:

$$P1_{XA,T}=P1_{XB,W}=P1_{YA,T}=P1_{YB,W}=1{,}030\text{ nm}$$

$$P1_{XA,W}=P1_{XB,T}=P1_{YA,W}=P1_{YB,T}=1{,}000\text{ nm}$$

The second structure P2 is also provided with A regions $R2_{XA,T}$ and $R2_{XA}$, and B regions $R2_{XB,T}$ and $R2_{XB,W}$ for performing differential detection. The periods of periodic patterns formed in the respective regions are as follows:

$$P2_{XA,T}=P2_{XB,W}=P2_{YA,T}=P2_{YB,W}=2{,}040\text{ nm}$$

$$P2_{XA,W}=P2_{XB,T}=P2_{YA,W}=P2_{YB,T}=1{,}800\text{ nm}$$

In the above configuration, the average period $P1_{ave}$ of the first structure P1 is 1,015 nm, and the periodic difference ΔP1 between the alignment marks 230 and 110 on the template 200 side and wafer 100 side is 30 nm. Each of the periods of periodic patterns constituting the first structure P1 falls within a range of 10% or less from the average period $P1_{ave}$. Further, the average period $P2_{ave}$ of the second structure P2 is 1,920 nm, and the periodic difference ΔP2 between the alignment marks 230 and 110 on the template 200 side and wafer 100 side is 240 nm. Each of the periods of periodic patterns constituting the second structure P2 falls within a range of 10% or less from the average period $P2_{ave}$.

Here, the vertical direction period of the checkered pattern (the period in the direction orthogonal to the structural period on the template 200 side) is 4,500 nm. Further, noise cancelling patterns 241*a*, 241*b*, 242*a*, 242*b*, 121*a*, 121*b*, and 122*b* are provided around the marks having the first structure P1 and the marks having the second structure P2, on the template 200 and wafer 100.

The overall size of the moire mark 300 described above is 158 μm×35 μm, which includes the noise cancelling patterns 241*a*, 241*b*, 242*a*, 242*b*, 121*a*, 121*b*, and 122*b*, and the rough detection mark $M_C$.

Further, each alignment mark 110 on the wafer 100 side includes a phase inversion section 116 at and near the boundary between the A region $R1_{XA,W}$ or $R2_{XA,W}$ and the B region $R1_{XB,W}$ or $R2_{XB,W}$. Each alignment mark 110 on the wafer 100 side is composed of a checkered pattern. Specifically, each alignment mark 110 on the wafer 100 side has a configuration in which the rectangular patterns 111 and 112 or 113 and 114 are arranged with predetermined periods in the X-direction and Y-direction. In the second embodiment, the phase inversion section 116 includes respective parts with phases inverted from those of the other regions, on the A region $R1_{XA,W}$ or $R2_{XA,W}$ side and the B region $R1_{XB,W}$ or $R2_{XB,W}$ side relative to the boundary between the A region $R1_{XA,W}$ or $R2_{XA,W}$ and the B region $R1_{XB,W}$ or $R2_{XB,W}$.

Figure 17A:
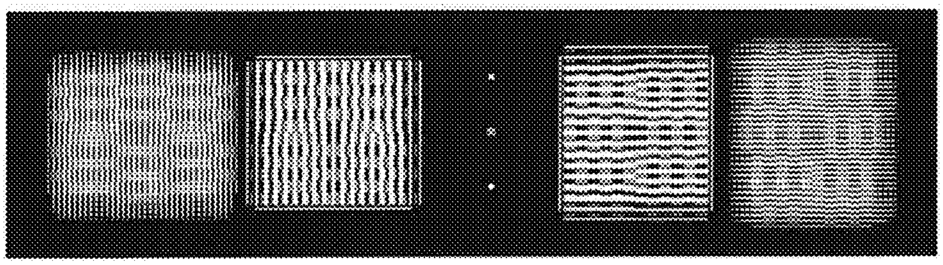
FIGS. 17A and 17B are diagrams illustrating an example of moire images obtained by moire marks.
Figure 17B:
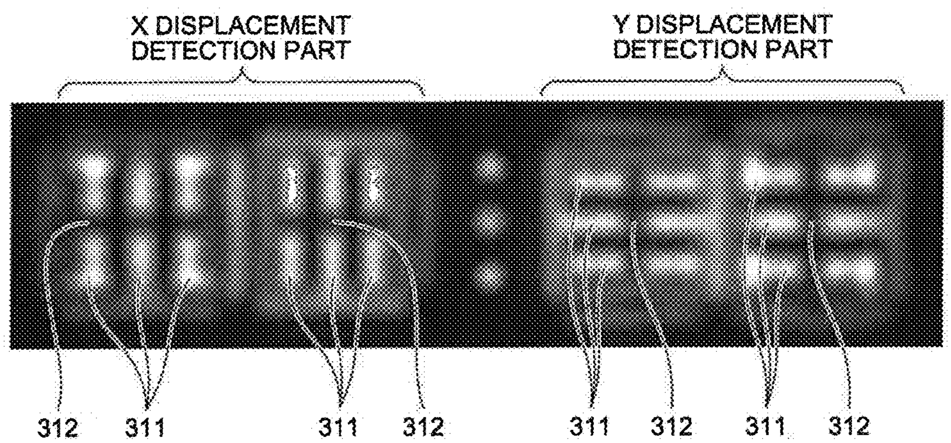

FIGS. 17A and 17B are diagrams illustrating an example of moire images obtained by moire marks. FIG. 17A is a diagram illustrating an example of a state where the alignment marks of FIGS. 15A and 16A are overlaid with each other and the alignment marks of FIGS. 15B and 16B are overlaid with each other (in both of the X- and Y-directions). FIG. 17B is a diagram illustrating an example of a simulation result of moire images that appear when the moire marks of FIGS. 15A, 15B, 16A, and 16B are used (in both of the X- and Y-directions). In FIG. 17A, moire patterns having periods larger than the structural periods of the alignment marks are illustrated.

As illustrated in FIG. 17B, white line portions correspond to ridges 311 of the moire images, and three ridges 311 are included in each of the moire images. In each of the moire images for detecting displacement in the X-direction, a black pattern 312 is seen that extends in the X-direction at and near the center in the Y-direction. Further, in each of the moire images for detecting displacement in the Y-direction, a black pattern 312 is seen that extends in the Y-direction at and near the center in the X-direction. Each of these black patterns 312 is a pattern formed by the phase inversion section 116, and indicates the boundary between the A region $R1_{XA,T}$, $R2_{XA,T}$, $R1_{XA,W}$, or $R2_{XA,W}$ and the B region $R1_{XB,T}$, $R2_{XB,T}$, $R1_{XB,W}$, or $R2_{XB}$. In this way, by using the phase inversion section 116, it is possible to perform monitoring in a state where the A region $R1_{XA,T}$, $R2_{XA,T}$, $R1_{XA,W}$, or $R2_{XA,W}$ and the B region $R1_{XB,T}$, $R2_{XB,T}$, $R1_{XB,W}$, or $R2_{XB,W}$ are separated from each other, and thereby to easily perform positioning.

In the second embodiment, the phase inversion section 116 with inverted phases is provided between the A region $R1_{XA,W}$ or $R2_{XA,W}$ and the B region $R1_{XB,W}$ or $R2_{XB,W}$, which are arranged to perform differential detection, on the wafer 100 side. Consequently, it is possible to observe the moire pattern of the A region $R1_{XA,W}$ or $R2_{XA,W}$ and the moire pattern of the B region $R1_{XB,W}$ or $R2_{XB,W}$ in a separated state when the moire mark 300 is monitored.

Figure 18:
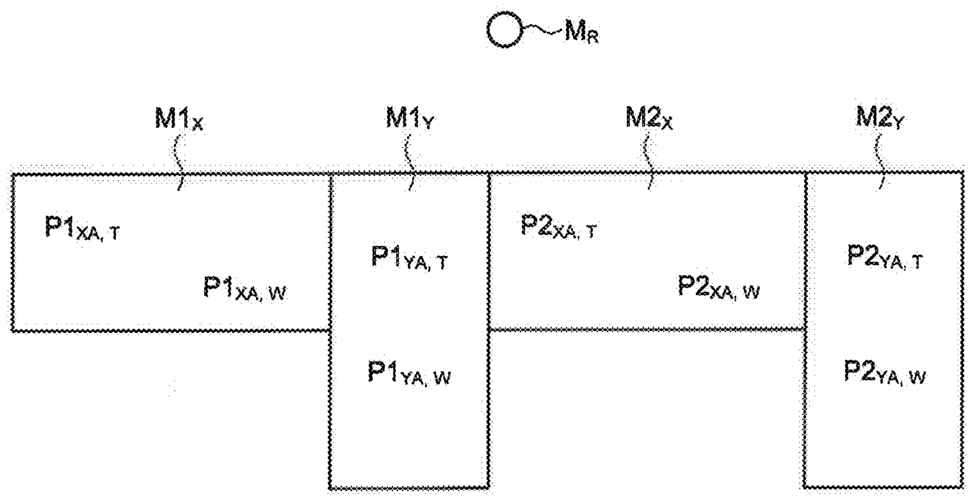
FIG. 18 is a top view schematically illustrating another example of arrangement of alignment marks according to the second embodiment.

In the above description, a case is illustrated where each alignment mark is provided with the A region and the B region, i.e., two regions to perform differential detection. However, where a reference position is used, the two regions are not necessarily required to be provided. FIG. 18 is a top view schematically illustrating another example of arrangement of alignment marks according to the second embodiment. As illustrated in FIG. 18, in addition to the marks $M1_X$, $M1_Y$, $M2_X$, and $M2_Y$ having the first structure P1 and second structure P2 different in positioning accuracy, a reference mark $M_R$ indicating the reference position may be provided. For example, the reference mark $M_R$ may be a rough detection mark. Each of the marks $M1_X$, $M1_Y$, $M2_X$, and $M2_Y$ having the first structure P1 and second structure P2 has only one region for detecting displacement in the X-direction or Y-direction (for example, the A region). In this case, for example, a displacement amount is obtained on the basis of the reference mark $M_R$ and the position of the central ridge of a moire image. However, as the displacement amount thus obtained is ½, correction is performed by using a displacement amount twice the displacement amount thus obtained.

Third Embodiment

A resist pattern transferred by an imprint method is used to perform a working process, such as etching or Chemical Mechanical Polishing (CMP), to a processing object. At this time, an alignment mark on a template has also been transferred onto the resist pattern, and the alignment mark is subjected to processing. Where a working process, such as etching or CMP, is performed in a state with the alignment mark transferred on the wafer side, stepped portions are formed on the processing object. If stepped portions are present on the processing object, a problem arises that positioning accuracy is lowered and/or pattern transfer becomes difficult in a subsequent imprint process. In the following embodiment made in consideration of the above problem, an explanation will be given of an imprint apparatus, an imprint method, and a semiconductor device manufacturing method, which can suppress generation of stepped portions due to an alignment mark.

Figure 19A:
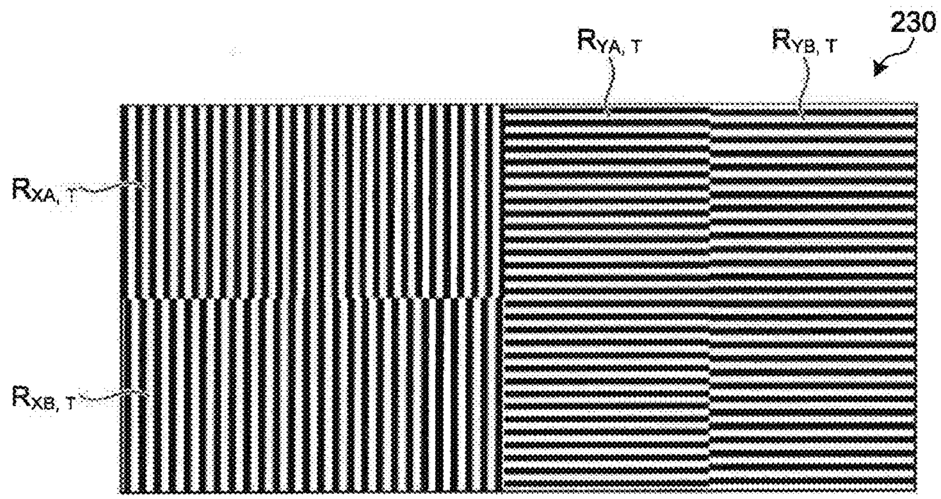
FIGS. 19A and 19B are top views illustrating a configuration example of a moire mark according to a third embodiment.
Figure 19B:
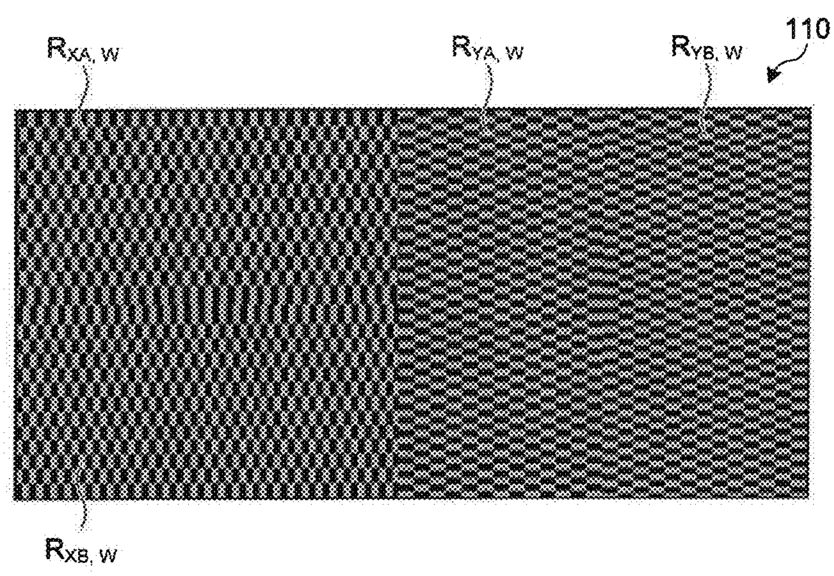

FIGS. 19A and 19B are top views illustrating a configuration example of a moire mark according to the third embodiment. FIG. 19A is a top view illustrating an example of a template-side alignment mark. FIG. 19B is a top view illustrating an example of a wafer-side alignment mark. The alignment marks 230 and 110 have the same arrangement configurations as those illustrated in FIG. 5. Each of the template 200 side and the wafer 100 side has a mark arrangement configuration to perform differential detection. Specifically, each of the alignment marks 230 and 110 on the template 200 side and wafer 100 side includes an XA region $R_{XA,T}$ or $R_{XA,W}$ and an XB region $R_{XB,T}$ or $R_{XB,W}$ for performing differential detection in the X-direction, and a YA region $R_{YA,T}$ or $R_{YA,W}$ and a YB region $R_{YB,T}$ or $R_{YB,W}$ for performing differential detection in the Y-direction. In this example, the alignment mark 230 on the template 200 side is composed of a pattern of lines arranged in parallel with each other. The alignment mark 110 on the wafer 100 side is composed of a pattern like a checkered pattern. Here, the structural periods of the patterns arranged in the respective regions satisfy the same conditions as those explained with reference to FIG. 5. Further, the line patterns constituting the alignment mark 230 on the template 200 side and the rectangular patterns constituting the alignment mark 110 on the wafer 100 side preferably have widths the same as those of the design rules for the pattern region $R_P$ (device formation pattern arrangement region $R_D$). Here, the design rules are rules to be applied to patterns arranged in the pattern region $R_P$ on the wafer. For example, the rules are exemplified by the maximum line width dimension, the coverage rate of a line-and-space pattern, the minimum processing line width of a pattern, and so forth. As regards the coverage rate of a line-and-space pattern, there is a case that defines the coverage rate of a pattern with minimum line width dimension and the coverage rate of a pattern with a line width dimension larger than the minimum line width dimension. Further, there is a case where the design rules are different between a memory cell region and a peripheral circuit region, for example.

Figure 20A:
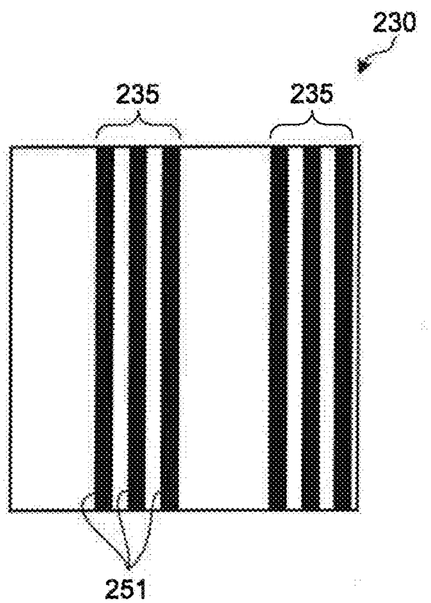
FIGS. 20A and 20B are partial enlarged views illustrating an example of a moire mark according to the third embodiment.
Figure 20B:
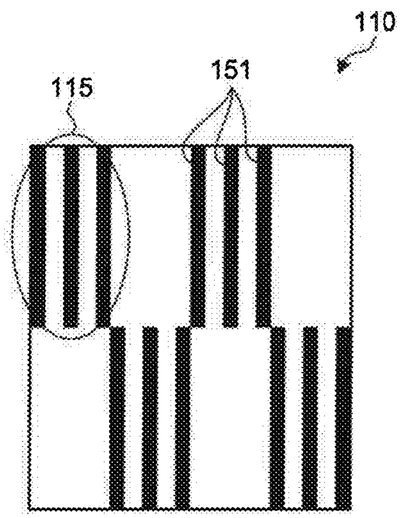

FIGS. 20A and 20B are partial enlarged views illustrating an example of a moire mark according to the third embodiment. FIG. 20A is a partial enlarged view illustrating an example of a template-side alignment mark. FIG. 20B is a partial enlarged view illustrating an example of a wafer-side alignment mark. In the third embodiment, as illustrated in FIG. 20A, the alignment mark 230 on the template 200 side is composed of line patterns 235, each of which is still composed of a plurality of first components 251. In this example, the first components 251 are linear patterns extending in the extending direction of the line patterns 235. Hereinafter, the extending direction of the first components 251 will be referred to as "first direction". The first components 251 are arranged at predetermined intervals in a direction intersecting with the first direction (for example, a direction perpendicular thereto), (hereinafter, this direction will be referred to as "second direction"). The first components 251 are formed of linear patterns, for example. Here, each line pattern 235 is divided into three portions in the second direction. Each line pattern 235 is composed of a plurality of first components 251, and the alignment mark 230 is composed of a plurality of line patterns 235.

Further, as illustrated in FIG. 20B, the alignment mark 110 on the wafer 100 side is composed of rectangular patterns 115, each of which is still composed of a plurality of second components 151. In this example, the second components 151 are linear patterns extending in the first direction. The second components 151 are arranged at predetermined intervals in the second direction. The second components 151 are formed of linear patterns, for example. Here, each rectangular pattern 115 is divided into three portions in the second direction. Each rectangular pattern 115 is composed of a plurality of second components 151, and the alignment mark 110 is composed of a plurality of rectangular patterns 115. Here, each first component 251 and each second component 151 are different from each other in width in the second direction.

An imprint method and a semiconductor device manufacturing method including positioning between the template 200 and the wafer 100 performed by using the moire mark described above are substantially the same as those described in the first embodiment.

In the third embodiment, each of the patterns constituting the alignment mark 230 on the template 200 side is composed of a plurality of first components 251 separated in the pattern width direction. Further, each of the patterns constituting the alignment mark 110 on the wafer 100 side is composed of a plurality of second components 151 separated in the pattern width direction. Consequently, when a process, such as CMP or etching, is performed in a state where an alignment mark has been transferred onto the wafer 100, as the pattern size in each Kerf region $R_K$ of the wafer 100 is almost the same as the pattern size in each pattern region $R_P$, the polishing or etching are developed equivalently in the two regions. As a result, it is possible to suppress generation of stepped portions on the wafer 100.

In the above description, each of the line patterns 235 constituting the alignment mark 230 on the template 200 side is divided into a plurality of first components 251, and each of the rectangular patterns 115 constituting the alignment mark 110 on the wafer 100 side is divided into a plurality of second components 151. However, even if either one of the alignment mark 230 on the template 200 side and the alignment mark 110 on the wafer 100 side is composed of patterns each divided into a plurality of components, substantially the same effect can be obtained.

Fourth Embodiment

Figure 21:
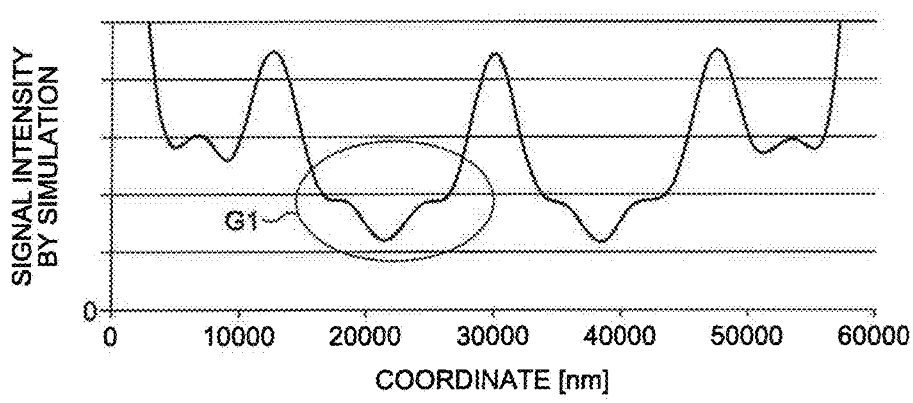
FIG. 21 is a graph illustrating an example of a simulation result of signal intensity obtained by using the moire mark according to the third embodiment.

FIG. 21 is a graph illustrating an example of a simulation result of signal intensity obtained by using the moire mark according to the third embodiment. In FIG. 21, the horizontal axis indicates the position in the position detection direction (first direction) of the moire mark, and the vertical axis indicates the signal intensity obtained by monitoring the moire mark by a dark field optical system. The three peaks seen in FIG. 21 correspond to portions appearing as ridges of the moire image. Specifically, in this example, the three ridges of the moire image come to be seen in the extent of the moire mark. Further, at trough portions G1 between the ridges, signal deformations are generated. If there are such signal deformations, the alignment accuracy is deteriorated in positioning. In the fourth embodiment, an explanation will be given of alignment marks that can suppress generation of signal deformations, as compared with the third embodiment.

Figure 22A:
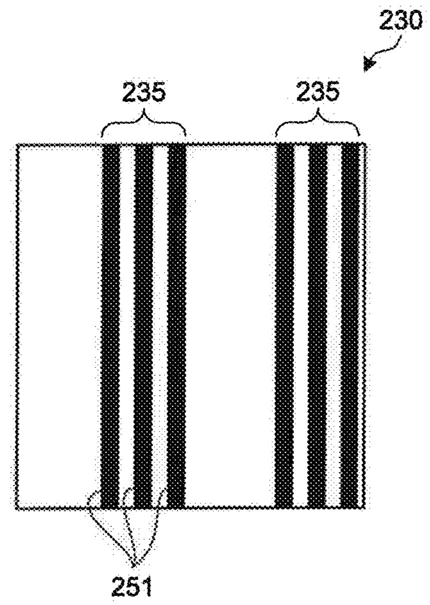
FIGS. 22A and 22B are partial enlarged views illustrating an example of a moire mark according to a fourth embodiment.
Figure 22B:
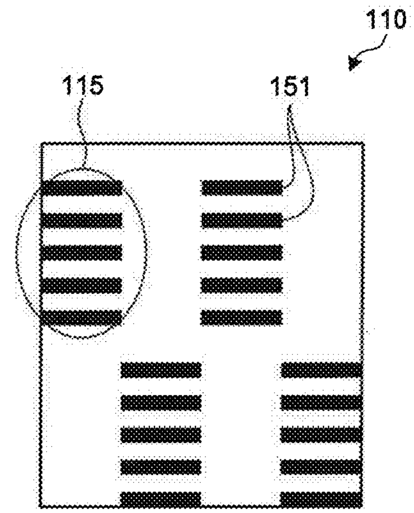

FIGS. 22A and 22B are partial enlarged views illustrating an example of a moire mark according to the fourth embodiment. FIG. 22A is a partial enlarged view illustrating an example of a template-side alignment mark. FIG. 22B is a partial enlarged view illustrating an example of a wafer-side alignment mark. Here, the configuration of the moire mark is substantially the same as that illustrated in FIGS. 19A and 19B. In this example, as illustrated in FIG. 22A, the alignment mark 230 on the template 200 side has the same configuration as that of the third embodiment. However, the alignment mark 110 on the wafer 100 side differs from that of the third embodiment, such that the second components 151 extend in a direction intersecting with the first direction. Hereinafter, an explanation will be given of parts different from those of the third embodiment.

As illustrated in FIG. 22B, the alignment mark 110 on the wafer 100 side is composed of rectangular patterns 115, each of which is composed of second components 151. The second components 151 are linear patterns extending in the second direction and are arranged at predetermined intervals in the first direction. Specifically, each rectangular pattern 115 is divided into a plurality of (five, in this example) portions in the first direction. The second components 151 are formed of linear patterns, for example. Here, the pitch of the first components 251 of the alignment mark 230 on the template 200 side is set equal to the pitch of the second components 151 of the alignment mark 110 on the wafer 100 side.

Figure 23:
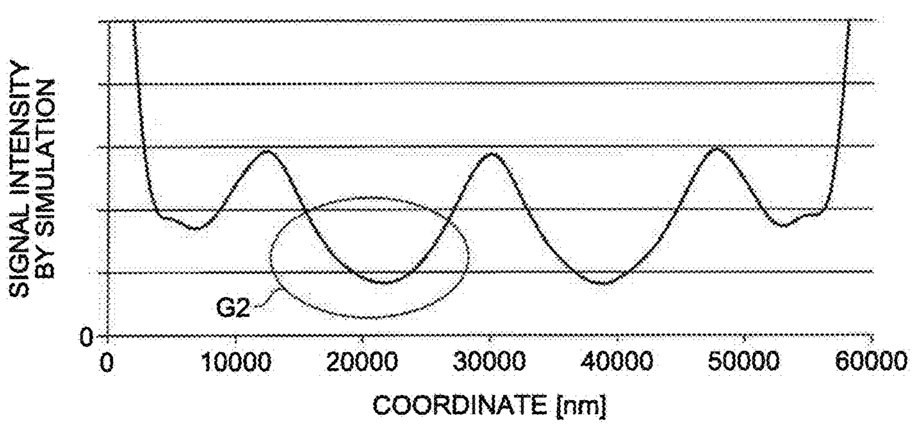
FIG. 23 is a graph illustrating an example of a simulation result of signal intensity obtained by using the moire mark according to the fourth embodiment.

FIG. 23 is a graph illustrating an example of a simulation result of signal intensity obtained by using the moire mark according to the fourth embodiment. In FIG. 23, the horizontal axis indicates the position in the displacement detection direction of the moire mark, and the vertical axis indicates the signal intensity obtained by monitoring the moire mark by a dark field optical system. As illustrated in FIG. 23, each of trough portions G2 between ridges draws a smoother waveform projecting downward, as compared with FIG. 21. Accordingly, when positioning is performed by monitoring the moire mark illustrated in FIGS. 22A and 22B by a dark field optical system, the positioning can be performed with high accuracy, without deteriorating the alignment accuracy.

As described above, by setting the long side of the first components 251 of the alignment mark 230 on the template 200 side to intersect with the long side of the second components 151 of the alignment mark 110 on the wafer 100 side, it is possible to make the signal waveform into a smoother shape.

An imprint method and a semiconductor device manufacturing method including positioning between the template 200 and the wafer 100 performed by using the moire mark described above are substantially the same as those described in the first embodiment.

Figure 24A:
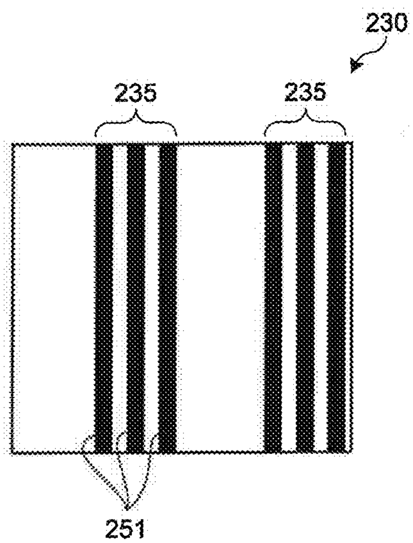
FIGS. 24A and 24B are partial enlarged views illustrating another example of a moire mark according to the fourth embodiment.
Figure 24B:
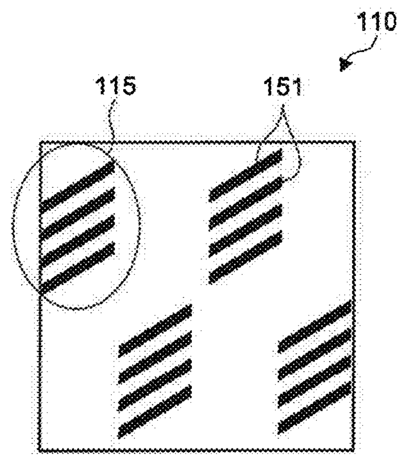

Further, FIGS. 22A and 22B take as an example a case where the extending direction of the long side of the first components 251 is orthogonal to the extending direction of the long side of the second components 151; however, the embodiment is not limited to this. FIGS. 24A and 24B are partial enlarged views illustrating another example of a moire mark according to the fourth embodiment. FIG. 24A is a partial enlarged view illustrating a template-side alignment mark. FIG. 24B is a partial enlarged view illustrating a wafer-side alignment mark. Here, the configuration of the moire mark is substantially the same as that illustrated in FIGS. 19A and 19B. In this example, as illustrated in FIG. 24A, the alignment mark 230 on the template 200 side has the same configuration as that of the third embodiment. On the other hand, as illustrated in FIG. 24B, the alignment mark 110 on the wafer 100 side is composed of rectangular patterns 115, each of which is composed of a plurality of second components 151. The second components 151 are linear patterns extending in a direction intersecting with the extending direction (first direction) of the long side of the components 251 by an angle other than 90° and are arranged at predetermined intervals in the first direction. Here, the pitch of the first components 251 is set equal to the pitch of the second components 151. Also when the moire mark having this configuration is monitored by a dark field optical system, it is possible to obtain a signal waveform entailing no signal deformation, as illustrated in FIG. 23.

In the fourth embodiment, the first components 251 of the alignment mark 230 on the template 200 side and the second components 151 of the alignment mark 110 on the wafer 100 side are configured such that the long side direction of the first components 251 intersects with the long side direction of the second components 151. Further, the pitch of the first components 251 is set equal to the pitch of the second components 151. Consequently, it is possible to suppress generation of signal deformations in the waveform indicating signal intensity, which is obtained by monitoring the moire mark by using a dark field optical system. As a result, it is possible to perform the positioning without deteriorating the alignment accuracy, in addition to the effect of the third embodiment.

Fifth Embodiment

Figure 25A:
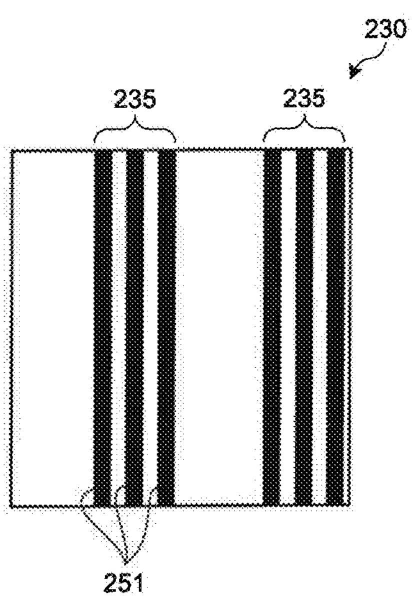
FIGS. 25A and 25B are partial enlarged views illustrating an example of a moire mark according to a fifth embodiment.
Figure 25B:
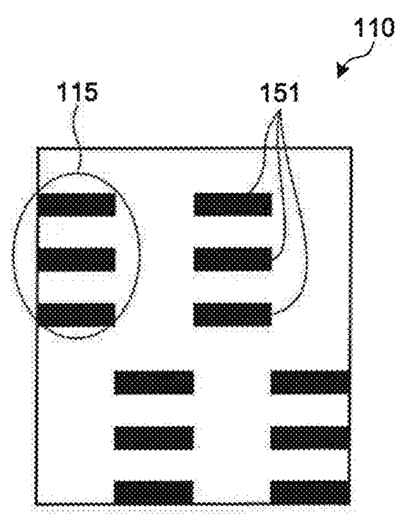

FIGS. 25A and 25B are partial enlarged views illustrating an example of a moire mark according to the fifth embodiment. FIG. 25A is a partial enlarged view illustrating a template-side alignment mark. FIG. 25B is a partial enlarged view illustrating a wafer-side alignment mark. Here, the configuration of the moire mark is substantially the same as that illustrated in FIGS. 19A and 19B. Also in this example, as illustrated in FIG. 25A, the alignment mark 230 on the template 200 side has the same configuration as that of the third embodiment. On the other hand, as illustrated in FIG. 25B, the alignment mark 110 on the wafer 100 side is composed of rectangular patterns 115, each of which is composed of a plurality of second components 151. The second components 151 are linear patterns extending in the second direction and are arranged at predetermined intervals in the first direction. Specifically, the extending direction of the long side of the second components 151 is orthogonal to the extending direction of the long side of the first components 251. However, unlike the fourth embodiment, the pitch of the first components 251 is set different from the pitch of the second components 151.

Figure 26:
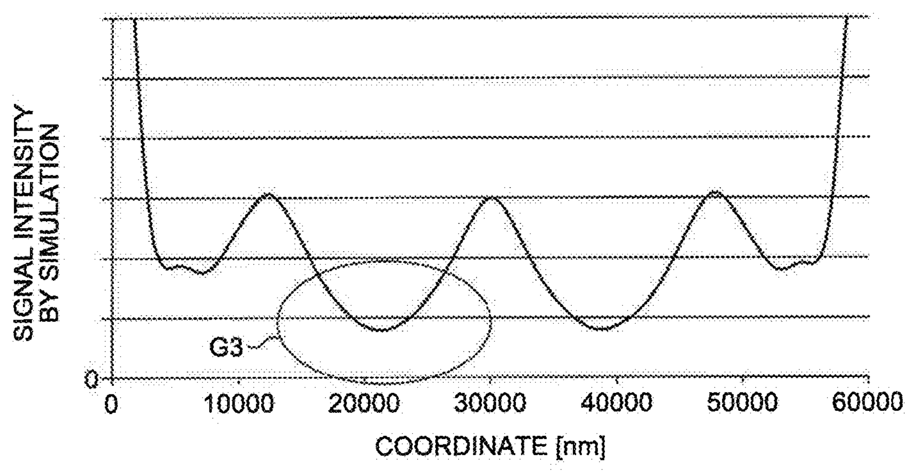
FIG. 26 is a graph illustrating an example of a simulation result of signal intensity obtained by using the moire mark according to the fifth embodiment.

FIG. 26 is a graph illustrating an example of a simulation result of signal intensity obtained by using the moire mark according to the fifth embodiment. Also in FIG. 26, the horizontal axis indicates the position in the displacement detection direction of the moire mark, and the vertical axis indicates the signal intensity obtained by monitoring the moire mark by a dark field optical system. As illustrated in FIG. 26, each of trough portions G3 between ridges draws a smoother waveform projecting downward, as compared with FIG. 21. Accordingly, when positioning is performed by monitoring the moire mark illustrated in FIGS. 25A and 25B by a dark field optical system, the positioning can be performed with high accuracy, without deteriorating the alignment accuracy.

Further, also with a configuration in which the extending direction of the long side of the second components 151 intersects with the extending direction of the long side of the first components 251 by an angle other than 90°, and the pitch of the second components 151 is set different from the pitch of the first components 251, it is possible to obtain signal intensity substantially the same as that illustrated in FIG. 26.

An imprint method and a semiconductor device manufacturing method including positioning between the template 200 and the wafer 100 performed by using the moire mark described above are substantially the same as those described in the first embodiment.

Also in the fifth embodiment, an effect substantially the same as that of the fourth embodiment can be obtained.

Sixth Embodiment

Figure 27A:
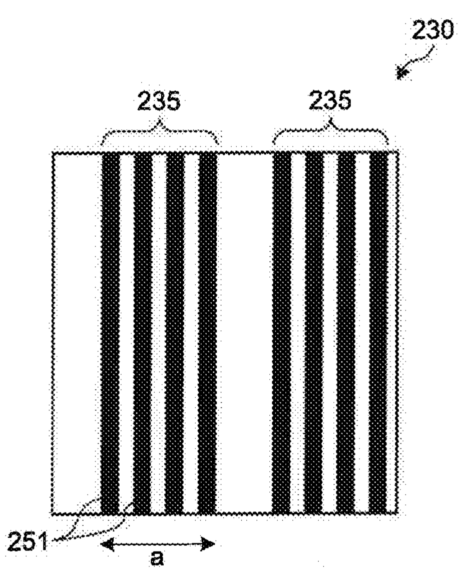
FIGS. 27A and 27B are partial enlarged views illustrating a moire mark according to a comparative example.
Figure 27B:
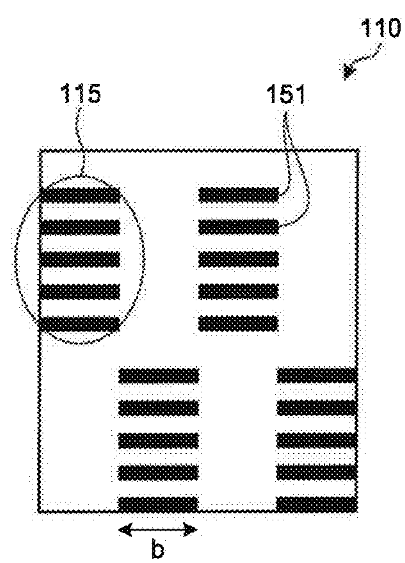

FIGS. 27A and 27B are partial enlarged views illustrating a moire mark according to a comparative example. FIG. 27A is a partial enlarged view illustrating a template-side alignment mark. FIG. 27B is a partial enlarged view illustrating a wafer-side alignment mark. Here, the configuration of the moire mark is substantially the same as that illustrated in FIGS. 19A and 19B. FIGS. 27A and 27B illustrate a moire mark substantially the same as that illustrated in FIGS. 22A and 22B according to the fourth embodiment. However, in FIG. 27A, each of the line patterns 235 of the alignment mark 230 on the template 200 side is divided into four portions. Further, the alignment mark 110 on the wafer 100 side has a structure substantially the same as that illustrated in FIG. 22B.

Here, it is assumed that the second direction width of each line pattern 235 of the alignment mark 230 on the template 200 side is denoted by "a", and the second direction width of each rectangular pattern 115 of the alignment mark 110 on the wafer 100 side is denoted by "b". The example illustrated in FIGS. 27A and 27B satisfy the relation of the following formula (13).

$$a>b \qquad (13)$$

Figure 28:
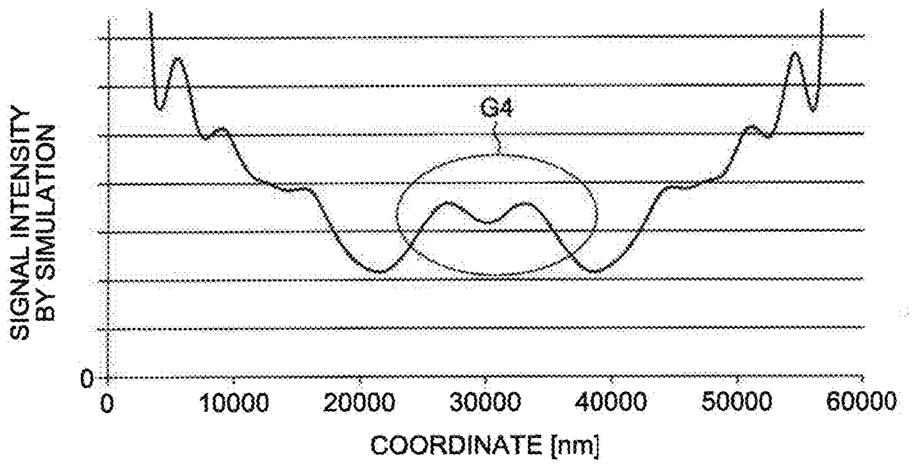
FIG. 28 is a graph illustrating an example of a simulation result of signal intensity obtained by using the moire mark illustrated in FIGS. 27A and 27B.

FIG. 28 is a graph illustrating an example of a simulation result of signal intensity obtained by using the moire mark illustrated in FIGS. 27A and 27B. In FIG. 28, the horizontal axis indicates the position in the displacement detection direction of the moire mark, and the vertical axis indicates the signal intensity obtained by monitoring the moire mark by a dark field optical system. As illustrated in FIG. 28, at a ridge portion G4 at the center, a signal deformation is generated. When positioning is performed by using this moire pattern, the signal intensity at the ridge portion of the moire image becomes dark, and the alignment accuracy is deteriorated.

Figure 29A:
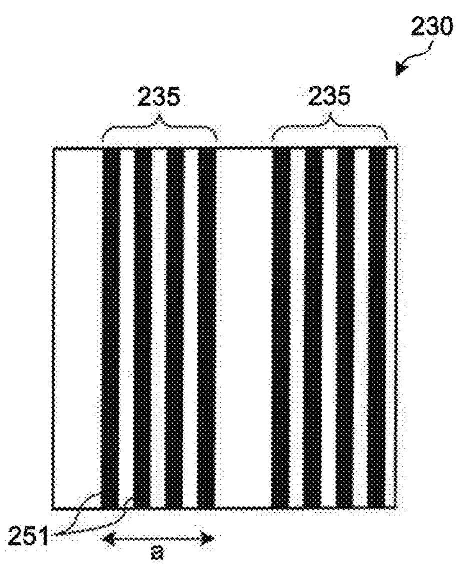
FIGS. 29A and 29B are partial enlarged views illustrating a moire mark according to a sixth embodiment.
Figure 29B:
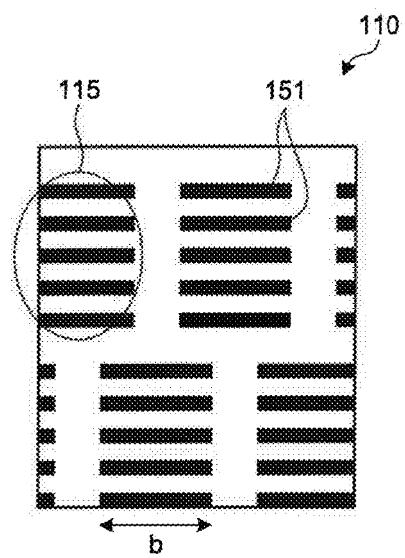

FIGS. 29A and 29B are partial enlarged views illustrating a moire mark according to the sixth embodiment. FIG. 29A is a partial enlarged view illustrating a template-side alignment mark. FIG. 29B is a partial enlarged view illustrating a wafer-side alignment mark. Here, the configuration of the moire mark is substantially the same as that illustrated in FIGS. 19A and 19B. Further, its basic arrangement is substantially the same as that illustrated in FIGS. 27A and 27B. However, the second direction width of each line pattern 235 of the alignment mark 230 on the template 200 side is set equal to the second direction width of each rectangular pattern 115 of the alignment mark 110 on the wafer 100 side. Thus, the relation between "a" and "b" satisfies the relation of the following formula (14).

$$a=b \qquad (14)$$

Figure 30:
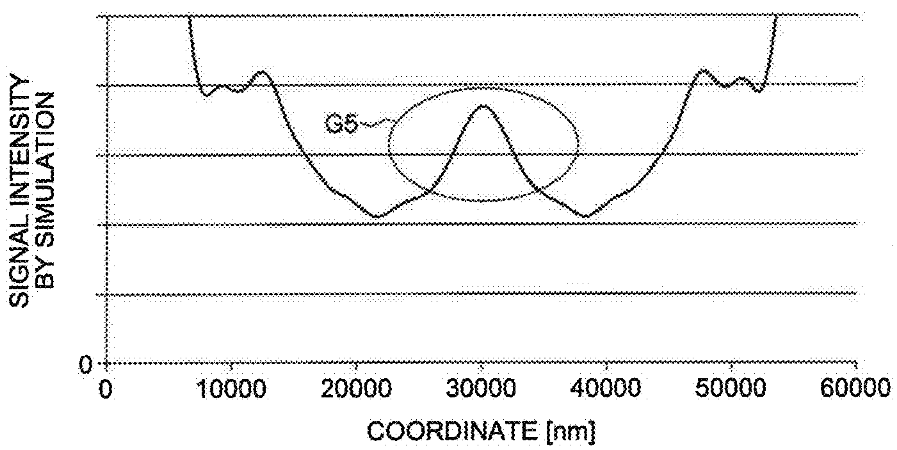
FIG. 30 is a graph illustrating an example of a simulation result of signal intensity obtained by using the moire mark according to the sixth embodiment.

FIG. 30 is a graph illustrating an example of a simulation result of signal intensity obtained by using the moire mark according to the sixth embodiment. In FIG. 30, the horizontal axis indicates the position in the displacement detection direction of the moire mark, and the vertical axis indicates the signal intensity obtained by monitoring the moire mark by a dark field optical system. As illustrated in FIG. 30, a smoothly shaped ridge waveform G5 appears at the center, and the signal deformation generated in FIG. 28 is suppressed. Accordingly, when positioning is performed by using this moire pattern, it is possible to sustain high alignment accuracy.

Here, an imprint method and a semiconductor device manufacturing method including positioning between the template 200 and the wafer 100 performed by using the moire mark described above are substantially the same as those described in the first embodiment.

In the sixth embodiment, the second direction width "a" of each line pattern 235 of the alignment mark 230 on the template 200 side is set equal to the second direction width "b" of each rectangular pattern 115 of the alignment mark 110 on the wafer 100 side. Consequently, it is possible to suppress generation of signal deformations, which are to be generated when the moire mark is monitored by a dark field optical system, and thereby to perform the positioning with high accuracy.

Seventh Embodiment

The third to sixth embodiments have taken as an example a case where one of the template-side alignment mark and the wafer-side alignment mark is divided into portions in the form of lines. The seventh and subsequent embodiments will take as an example a case where one of the template-side alignment mark and the wafer-side alignment mark is divided into portions in the form of contact holes.

Figure 31A:
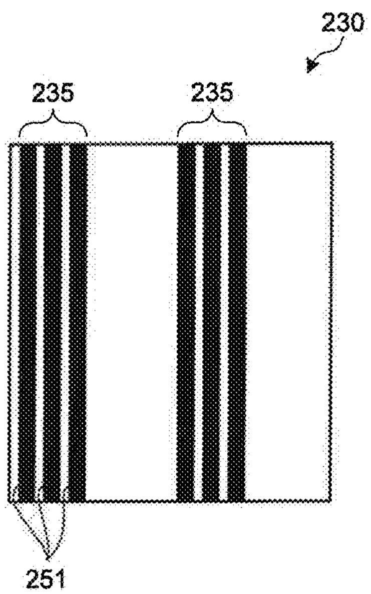
FIGS. 31A and 31B are partial enlarged views illustrating a configuration example of a moire mark according to a seventh embodiment.
Figure 31B:
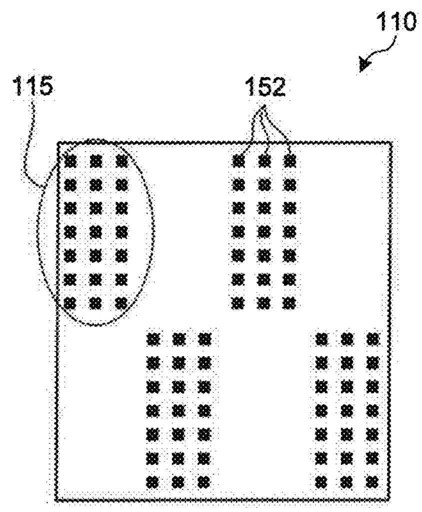

FIGS. 31A and 31B are partial enlarged views illustrating a configuration example of a moire mark according to the seventh embodiment. FIG. 31A is a partial enlarged view illustrating a template-side alignment mark. FIG. 31B is a partial enlarged view illustrating a wafer-side alignment mark. Here, the configuration of the moire mark is substantially the same as that illustrated in FIGS. 19A and 19B. In this example, as illustrated in FIG. 31A, the alignment mark 230 on the template 200 side has the same configuration as that of the third embodiment. On the other hand, as illustrated in FIG. 31B, the alignment mark 110 on the wafer 100 side is composed of rectangular patterns 115, each of which is composed of a plurality of second components 152. Specifically, the second components 152 are contact hole-like patterns periodically arranged in the first direction and the second direction. In this example, each rectangular pattern 115 is divided into three portions in the second direction, and is divided into seven portions in the first direction. Here, each contact hole-like pattern may have a rectangular, circular, elliptical, or other shape.

An imprint method and a semiconductor device manufacturing method including positioning between the template 200 and the wafer 100 performed by using the moire mark described above are substantially the same as those described in the first embodiment.

Also in the seventh embodiment, an effect substantially the same as that of the third embodiment can be obtained.

Eighth Embodiment

Figure 32:
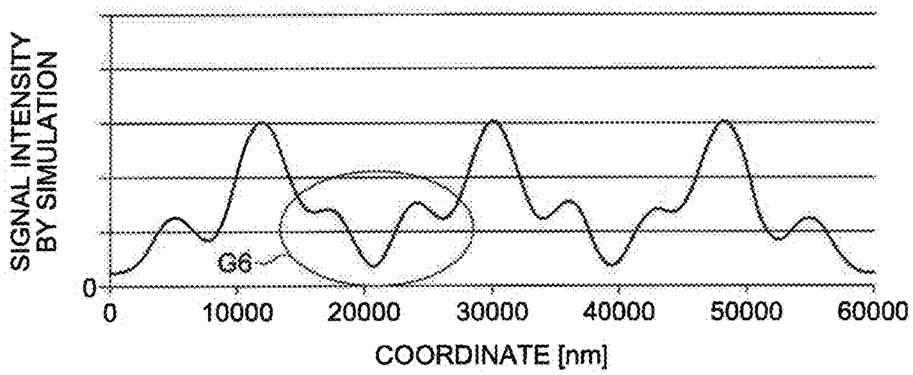
FIG. 32 is a graph illustrating an example of a simulation result of signal intensity obtained by using the moire mark according to the seventh embodiment.

FIG. 32 is a graph illustrating an example of a simulation result of signal intensity obtained by using the moire mark according to the seventh embodiment. In FIG. 32, the horizontal axis indicates the position in the displacement detection direction of the moire mark, and the vertical axis indicates the signal intensity obtained by monitoring the moire mark by a dark field optical system. As illustrated in FIG. 32, the signal waveform includes three smooth ridges, and troughs G6 with signal deformations generated therein between these ridges. If the signal waveform includes such portions with signal deformations generated therein, the alignment accuracy is deteriorated in positioning. In the eighth embodiment made in consideration of the above problem, an explanation will be given of alignment marks that can suppress generation of signal deformations, as compared with the seventh embodiment.

Figure 33A:
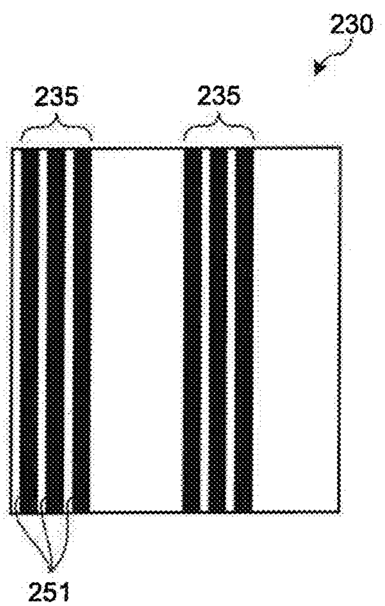
FIGS. 33A and 33B are partial enlarged views illustrating an example of a moire mark according to an eighth embodiment.
Figure 33B:
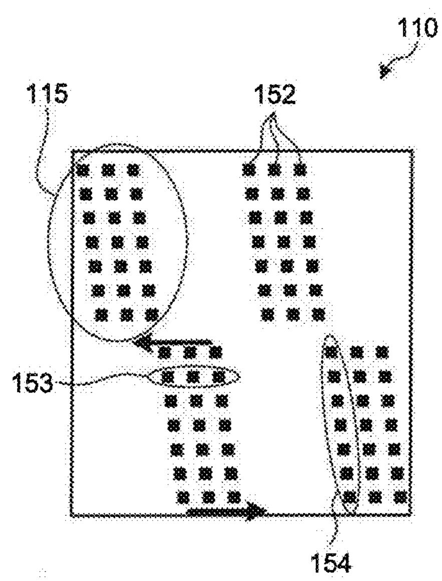

FIGS. 33A and 33B are partial enlarged views illustrating an example of a moire mark according to the eighth embodiment. FIG. 33A is a partial enlarged view illustrating a template-side alignment mark. FIG. 33B is a partial enlarged view illustrating a wafer-side alignment mark. Here, the configuration of the moire mark is substantially the same as that illustrated in FIGS. 19A and 19B. In this example, as illustrated in FIG. 31A, the alignment mark 230 on the template 200 side has the same configuration as that of the third embodiment. Further, the alignment mark 110 on the wafer 100 side is composed of second components 152, which are contact hole-like patterns arranged in a two-dimensional state, as in the seventh embodiment. However, in the eighth embodiment, the configuration of each rectangular pattern 115 is defined as follows: Where one row of second components 152 arrayed in the second direction is referred to as "component row" 153, the second direction positions of the component rows 153 are gradually shifted in the positive direction or negative direction of the first direction from one end toward the other end. In other words, the component rows 153 are arrayed at a slant in the second direction.

Alternatively, the configuration of each rectangular pattern 115 is defined as follows: Where one column of second components 152 arrayed in the first direction is referred to as "component column" 154, the second components 152 are arrayed such that the extending direction of the component columns 154 intersects with the extending direction of the first components 251 of the alignment mark 230 on the template 200 side. Here, the arrangement period of the first components 251 and the arrangement period of the second components 152 may be set the same as each other or different from each other.

Figure 34:
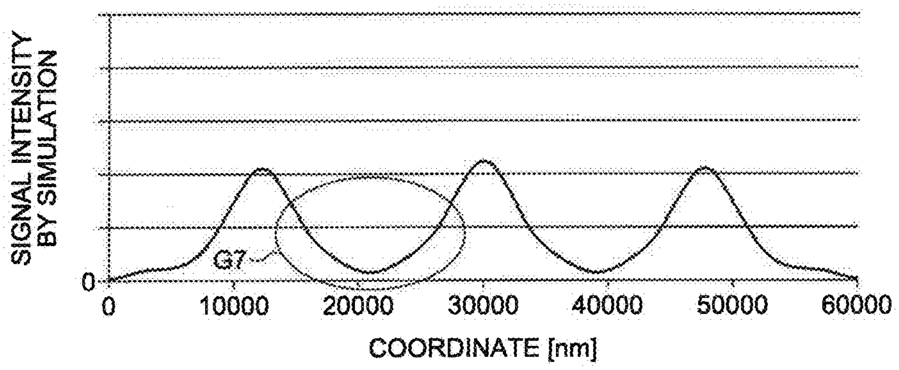
FIG. 34 is a graph illustrating an example of a simulation result of signal intensity obtained by using the moire mark according to the eighth embodiment.

FIG. 34 is a graph illustrating an example of a simulation result of signal intensity obtained by using the moire mark according to the eighth embodiment. In FIG. 34, the horizontal axis indicates the position in the displacement detection direction of the moire mark, and the vertical axis indicates the signal intensity obtained by monitoring the moire mark by a dark field optical system. As illustrated in FIG. 34, each of trough portions G7 between ridges draws a smoother waveform projecting downward, and signal deformations are suppressed, as compared with FIG. 32. Accordingly, when positioning is performed by monitoring the moire mark illustrated in FIGS. 33A and 33B by a dark field optical system, the positioning can be performed with high accuracy, without deteriorating the alignment accuracy.

Figure 35A:
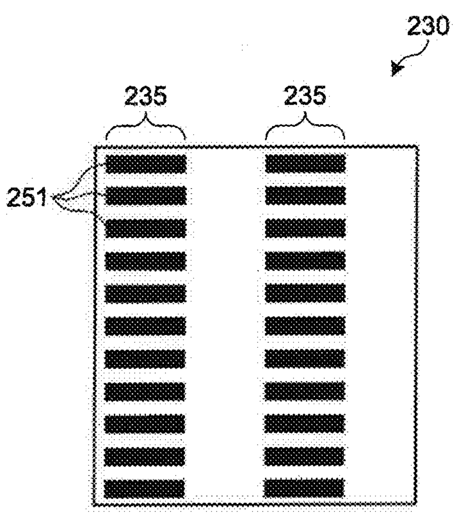
FIGS. 35A and 35B are partial enlarged views illustrating another example of a moire mark according to the eighth embodiment.
Figure 35B:
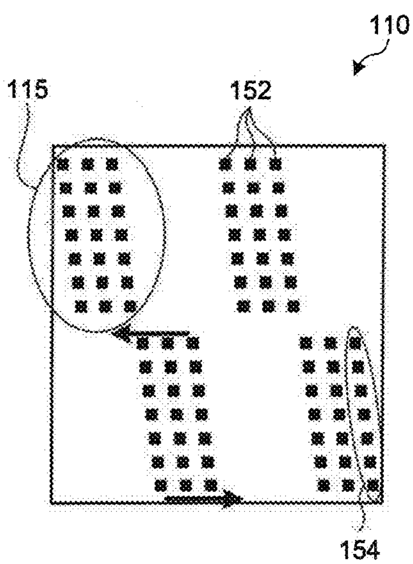

Here, the moire mark illustrated in FIGS. 33A and 33B is taken as an example of a case where the extending direction of the first components 251 and the extending direction of the component columns 154 of the second components 152 intersect with each other. However, such a case where the extending direction of the first components 251 and the extending direction of the component columns 154 of the second components 152 intersect with each other is not limited to this example. FIGS. 35A and 35B are partial enlarged views illustrating another example of a moire mark according to the eighth embodiment. FIG. 35A is a partial enlarged view illustrating a template-side alignment mark. FIG. 35B is a partial enlarged view illustrating a wafer-side alignment mark. Here, the configuration of the moire mark is substantially the same as that illustrated in FIGS. 19A and 19B. In this example, as illustrated in FIG. 35B, the alignment mark 110 on the wafer 100 side has a configuration substantially the same as that illustrated in FIG. 33B. On the other hand, as illustrated in FIG. 35A, the alignment mark 230 on the template 200 side is divided in the extending direction of the line patterns 235 constituting the alignment mark 230. Specifically, the first components 251 have a shape extending in the width direction of the line patterns 235. Accordingly, in the eighth embodiment, a first direction is not the extending direction of the line patterns 235 constituting the alignment mark 230, but the width direction thereof. The extending direction of the line patterns 235 is a second direction. With this configuration, the extending direction of the first components 251 and the extending direction of the component columns 154 of the second components 152 come to intersect with each other. As a result, also when this moire mark is used to perform monitoring by a dark field optical system, it is possible to obtain a signal waveform substantially the same as that illustrated in FIG. 34.

Figure 36A:
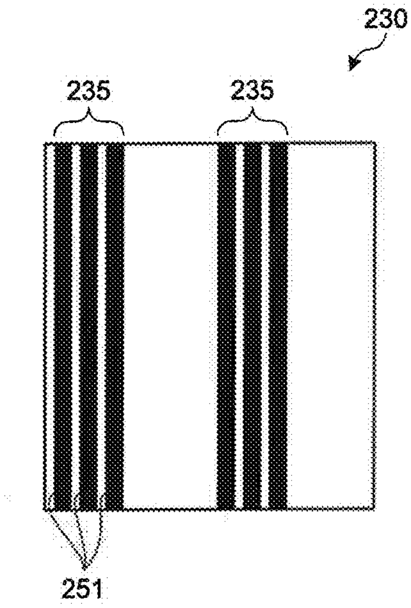
FIGS. 36A and 36B are partial enlarged views illustrating another example of a moire mark according to the eighth embodiment.
Figure 36B:
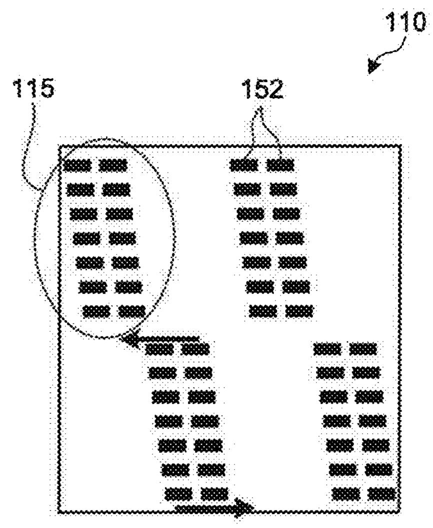

Here, the arrangement period of the first components 251 and the arrangement period of the second components 152 may be set the same as each other or different from each other. FIGS. 36A and 36B are partial enlarged views illustrating another example of a moire mark according to the eighth embodiment. FIG. 36A is a partial enlarged view illustrating a template-side alignment mark. FIG. 36B is a partial enlarged view illustrating a wafer-side alignment mark. Here, the configuration of the moire mark is substantially the same as that illustrated in FIGS. 19A and 19B. In this example, as illustrated in FIG. 36A, the alignment mark 230 on the template 200 side has a configuration substantially the same as that illustrated in FIG. 33A. Further, the alignment mark 110 on the wafer 100 side has a configuration similar to that illustrated in FIG. 33B. However, in FIG. 33B, each rectangular pattern 115 is divided into three portions in the second direction, while, in FIG. 36B, each rectangular pattern 115 is divided into two portions in the second direction. In FIGS. 36A and 36B, the arrangement period of the first components 251 of the alignment mark 230 on the template 200 side is set different from the arrangement period of the second components 152 of the alignment mark 110 on the wafer 100 side. Also when this moire mark is used to perform monitoring by a dark field optical system, it is possible to obtain a signal waveform substantially the same as that illustrated in FIG. 34.

Here, an imprint method and a semiconductor device manufacturing method including positioning between the template 200 and the wafer 100 performed by using the moire mark described above are substantially the same as those described in the first embodiment.

Also in the eighth embodiment, an effect substantially the same as that of the fourth embodiment can be obtained.

Ninth Embodiment

Figure 37A:
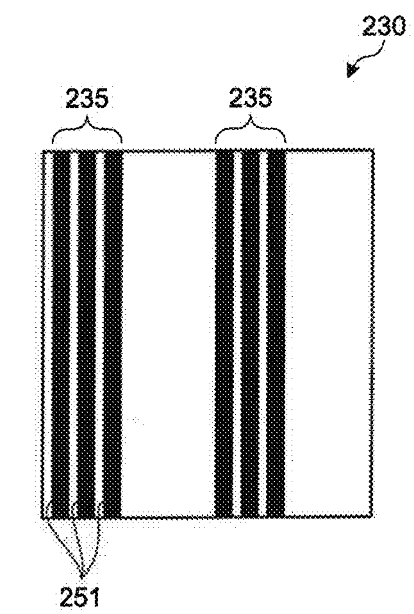
FIGS. 37A and 37B are partial enlarged views illustrating an example of a moire mark according to a ninth embodiment.
Figure 37B:
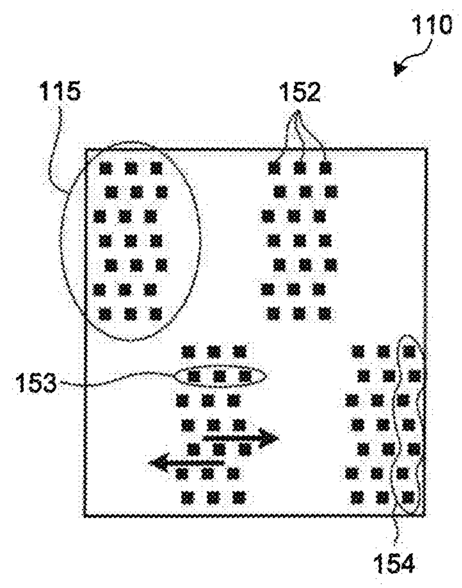

FIGS. 37A and 37B are partial enlarged views illustrating an example of a moire mark according to the ninth embodiment. FIG. 37A is a partial enlarged view illustrating a template-side alignment mark. FIG. 37B is a partial enlarged view illustrating a wafer-side alignment mark. Here, the configuration of the moire mark is substantially the same as that illustrated in FIGS. 19A and 19B. In this example, as illustrated in FIG. 37A, the alignment mark 230 on the template 200 side has a configuration the same as that of the third embodiment. Further, the alignment mark 110 on the wafer 100 side is composed of second components 152, which are contact hole-like patterns arranged in a two-dimensional state, as in the seventh embodiment. However, in the ninth embodiment, the configuration of each rectangular pattern 115 is defined as follows: Where one row of second components 152 arrayed in the second direction is referred to as "component row" 153, the ends of the component rows 153 are arranged in a zigzag state in the first direction from one end toward the other end. In other words, in this configuration, the ends of the component rows 153 are alternately projected in the positive direction and negative direction of the second direction.

Alternatively, the configuration of each rectangular pattern 115 is defined as follows: Where one column of second components 152 arrayed in the first direction is referred to as "component column" 154, the component columns 154 extend in a zigzag state in the first direction, and are arranged in parallel with each other in the second direction. In this way, in the ninth embodiment, the component columns 154 of the second components 152 of the alignment mark 110 on the wafer 100 side are arrange not to be in parallel with the extending direction of the first components 251 of the alignment mark 230 on the template 200 side.

Figure 38:
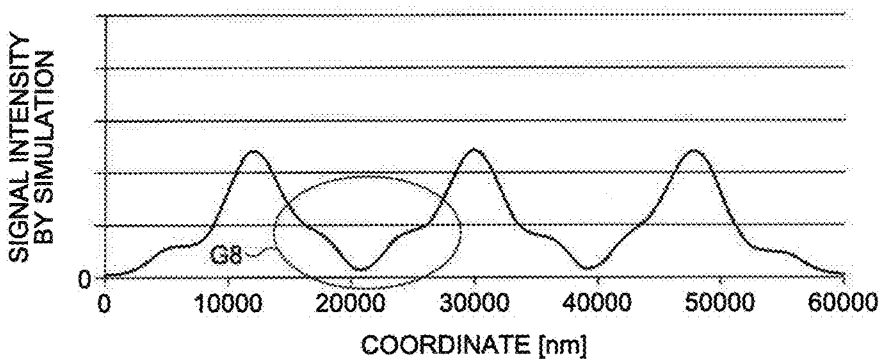
FIG. 38 is a graph illustrating an example of a simulation result of signal intensity obtained by using the moire mark according to the ninth embodiment.

FIG. 38 is a graph illustrating an example of a simulation result of signal intensity obtained by using the moire mark according to the ninth embodiment. In FIG. 38, the horizontal axis indicates the position in the displacement detection direction of the moire mark, and the vertical axis indicates the signal intensity obtained by monitoring the moire mark by a dark field optical system. As illustrated in FIG. 38, at trough portions G8 between ridges, signal deformations are reduced, as compared with FIG. 32. Accordingly, when positioning is performed by monitoring the moire mark illustrated in FIGS. 37A and 37B by a dark field optical system, the positioning can be performed with high accuracy, without deteriorating the alignment accuracy.

Here, an imprint method and a semiconductor device manufacturing method including positioning between the template 200 and the wafer 100 performed by using the moire mark described above are substantially the same as those described in the first embodiment.

Also in the ninth embodiment, an effect substantially the same as that of the fourth embodiment can be obtained.

Tenth Embodiment

Figure 39A:
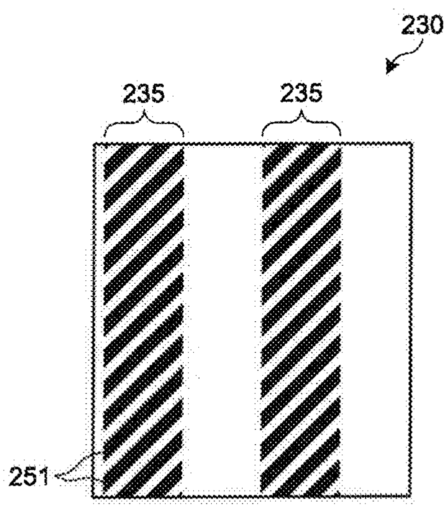
FIGS. 39A and 39B are partial enlarged views illustrating an example of a moire mark according to a tenth embodiment.
Figure 39B:
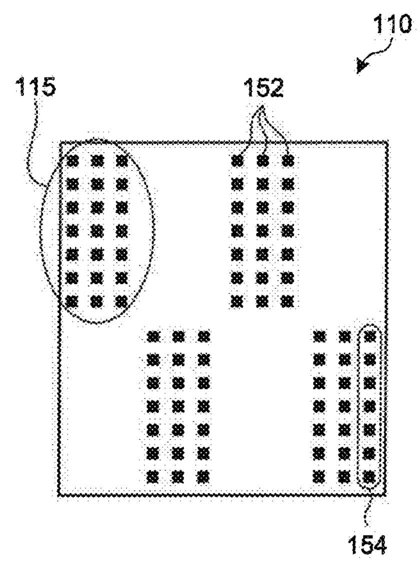

FIGS. 39A and 39B are partial enlarged views illustrating an example of a moire mark according to the tenth embodiment. FIG. 39A is a partial enlarged view illustrating a template-side alignment mark. FIG. 39B is a partial enlarged view illustrating a wafer-side alignment mark. Here, the configuration of the moire mark is substantially the same as that illustrated in FIGS. 19A and 19B. In this example, as illustrated in FIG. 39B, the alignment mark 110 on the wafer 100 side has a configuration the same as that illustrated in FIG. 31B. On the other hand, as illustrated in FIG. 39A, the alignment mark 230 on the template 200 side is composed of line patterns 235, each of which is composed of a plurality of first components 251 that extend in a direction intersecting with the extending direction of the line patterns 235. Specifically, the plurality of first components 251 are linear patterns extending in a direction intersecting with the extending direction of the component columns 154 of the alignment mark 110 on the wafer 100 side by an angle other than 90°, and are arranged at predetermined intervals in the extending direction of the line patterns 235.

Figure 40:
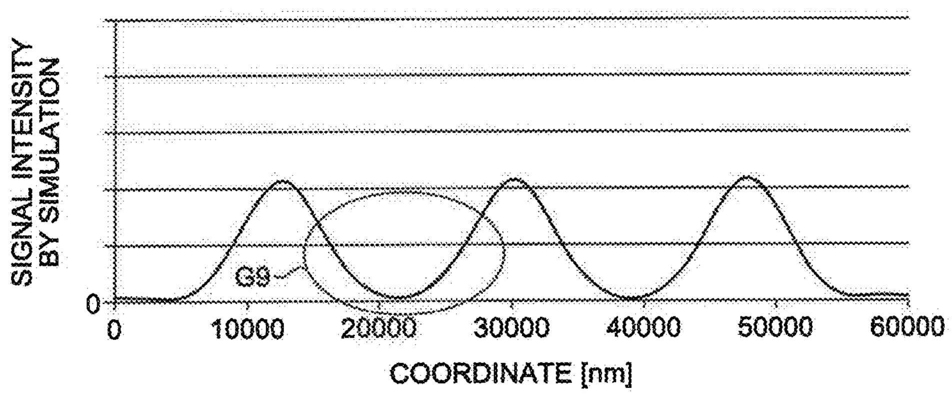
FIG. 40 is a graph illustrating an example of a simulation result of signal intensity obtained by using the moire mark according to the tenth embodiment.

FIG. 40 is a graph illustrating an example of a simulation result of signal intensity obtained by using the moire mark according to the tenth embodiment. In FIG. 40, the horizontal axis indicates the position in the displacement detection direction of the moire mark, and the vertical axis indicates the signal intensity obtained by monitoring the moire mark by a dark field optical system. As illustrated in FIG. 40, each of trough portions G9 between ridges draws a smoother waveform projecting downward, as compared with FIG. 32. Accordingly, when positioning is performed by monitoring the moire mark illustrated in FIGS. 39A and 39B by a dark field optical system, the positioning can be performed with high accuracy, without deteriorating the alignment accuracy.

Here, an imprint method and a semiconductor device manufacturing method including positioning between the template 200 and the wafer 100 performed by using the moire mark described above are substantially the same as those described in the first embodiment.

Also in the tenth embodiment, an effect substantially the same as that of the fourth embodiment can be obtained.

In each of the third to tenth embodiments described above, the alignment mark 230 on the template 200 side and the alignment mark 110 on the wafer 100 side may be exchanged for each other.

Further, other than an imprint method, each of the moire marks described above may be applied to a transfer method, such as contact exposure or proximity exposure, in which patterning is performed by setting a transfer pattern (such as a template or mask) in contact with a transfer destination (such as a wafer or substrate) or in a similar state.

(Note)

[Note 1]

An imprint apparatus comprising:

a template holder that holds a template that includes a first alignment mark detecting displacement in a first direction;

a processing object holder that holds a processing object that includes a second alignment mark detecting displacement in the first direction;

a monitor that optically monitors a state where the first alignment mark and the second alignment mark are overlaid with each other; and a first moving part that moves at least one of the template holder and the processing object holder in the first direction, on the basis of a monitoring result obtained by the monitor, wherein the first alignment mark includes a plurality of first marks arranged with a first period in the first direction, the second alignment mark includes a plurality of second marks arranged with a second period in the first direction, the first alignment mark and the second alignment mark are configured to be overlaid with each other to constitute a moire mark, and either one of each of the first marks and each of the second marks is composed of a plurality of components.

[Note 2]

The imprint apparatus according to Note 1, wherein each of the first marks is composed of a plurality of first components, and each of the second marks is composed of a plurality of second components.

[Note 3]

The imprint apparatus according to Note 2, wherein a long side direction of the first components differs from a long side direction of the second components.

[Note 4]

The imprint apparatus according to Note 2, wherein each of the first marks and each of the second marks are composed of a pattern having a line width smaller than a line width of a main body pattern that includes a device and a wiring line to be transferred to the processing object.

[Note 5]

The imprint apparatus according to Note 2, wherein the first period differs from the second period.

[Note 6]

The imprint apparatus according to Note 2, wherein each of the first marks has a configuration in which the first components are periodically arranged with a third period, and each of the second marks has a configuration in which the second components are arranged with the third period.

[Note 7]

The imprint apparatus according to Note 2, wherein each of the first marks has a configuration in which the first components are periodically arranged with a third period, and each of the second marks has a configuration in which the second components are arranged with a fourth period different from the third period.

[Note 8]

The imprint apparatus according to Note 2, wherein a width of each of the first marks in the first direction is equal to a width of each of the second marks in the first direction.

[Note 9]

The imprint apparatus according to Note 1, further comprising a second moving part that moves at least one of the template holder and the processing object holder in a second direction orthogonal to the first direction, on the basis of a monitoring result obtained by the monitor, wherein the template includes a third alignment mark detecting displacement in the second direction, the processing object includes a fourth alignment mark detecting displacement in the second direction, and the third alignment mark and the fourth alignment mark are marks obtained by rotating the first alignment mark and the second alignment mark, respectively, by 90° in a plane defined by the first direction and the second direction.

[Note 10]

The imprint apparatus according to Note 2, wherein the first components and the second components are linear patterns.

[Note 11]

The imprint apparatus according to Note 2, wherein each of the first marks has a configuration in which the first components, which are a plurality of linear patterns, are arranged in parallel with each other, and each of the second marks has a configuration in which the second components, which are a plurality of contact hole-like patterns, are arranged in a two-dimensional state.

[Note 12]

The imprint apparatus according to Note 11, wherein the first components are the linear patterns extending in a second direction orthogonal to the first direction, and each of the second marks has a configuration in which component rows of the second components arrayed in the first direction are shifted from each other in the first direction depending on positions in the second direction.

[Note 13]

The imprint apparatus according to Note 11, wherein the first components are the linear patterns extending in the first direction, and each of the second marks has a configuration in which component rows of the second components arrayed in the first direction are shifted from each other in the first direction depending on positions in a second direction orthogonal to the first direction.

[Note 14]

The imprint apparatus according to Note 11, wherein the first components are the linear patterns extending in a second direction orthogonal to the first direction, and the second components have a shape in which a length in the first direction is larger than a length in the second direction.

[Note 15]

The imprint apparatus according to Note 11, wherein each of the first marks and each of the second marks are composed of a pattern having a line width smaller than a line width of a main body pattern that includes a device and a wiring line to be transferred to the processing object.

[Note 16]

The imprint apparatus according to Note 11, wherein each of the first marks has a configuration in which the first components, which are a plurality of contact hole-like patterns, are arranged in a two-dimensional state, and each of the second marks has a configuration in which the second components, which are a plurality of linear patterns, are arranged in parallel with each other.

[Note 17]

The imprint apparatus according to Note 11, wherein the first alignment mark includes a line-and-space pattern in which a plurality line patterns extending in a second direction orthogonal to the first direction are arranged in parallel with each other, and the second alignment mark includes a checkered pattern in which rectangular patterns are arranged in a two-dimensional state in the first direction and the second direction.

[Note 18]

The imprint apparatus according to Note 11, wherein the first alignment mark includes a checkered pattern in which rectangular patterns are arranged in a two-dimensional state in the first direction and a second direction orthogonal to the second direction, and the second alignment mark includes a line-and-space pattern in which a plurality line patterns extending in the second direction are arranged in parallel with each other.

[Note 19]

An imprint method comprising:

arranging a template and a processing object to face each other, the template including a first alignment mark detecting displacement in a first direction, the processing object including a second alignment mark detecting displacement in the first direction, to face each other;

applying a resist onto the processing object;

bringing the template into contact with the resist;

optically monitoring a state where the first alignment mark and the second alignment mark are overlaid with each other, under a state where the template is set in contact with the resist; and performing positioning by moving at least one of the template and the processing object in the first direction, on the basis of a monitoring result, wherein the first alignment mark includes a plurality of first marks arranged with a first period in the first direction, the second alignment mark includes a plurality of second marks arranged with a second period in the first direction, the first alignment mark and the second alignment mark are configured to be overlaid with each other to constitute a moire mark, and either one of each of the first marks and each of the second marks is composed of a plurality of components.

[Note 20]

A semiconductor device manufacturing method comprising:

arranging a template and a processing object to face each other, the template including a first alignment mark detecting displacement in a first direction, the processing object including a second alignment mark detecting displacement in the first direction, to face each other;

applying a resist onto the processing object;

bringing the template into contact with the resist;

optically monitoring a state where the first alignment mark and the second alignment mark are overlaid with each other, under a state where the template is set in contact with the resist;

performing positioning by moving at least one of the template and the processing object in the first direction, on the basis of a monitoring result, curing the resist, after recessed patterns of the template are filled with the resist;

separating the template from the resist; and processing the processing object by using the resist thus cured, wherein the first alignment mark includes a plurality of first marks arranged with a first period in the first direction, the second alignment mark includes a plurality of second marks arranged with a second period in the first direction, the first alignment mark and the second alignment mark are configured to be overlaid with each other to constitute a moire mark, and either one of each of the first marks and each of the second marks is composed of a plurality of components.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An imprint apparatus comprising:

a template holder that holds a template that includes a first alignment mark detecting displacement in a first direction;

a processing object holder that holds a processing object that includes a second alignment mark detecting displacement in the first direction;

a monitor that optically monitors a state where the first alignment mark and the second alignment mark are overlaid with each other; and a first moving part that moves at least one of the template holder and the processing object holder in the first direction, on a basis of a monitoring result obtained by the monitor, wherein the first alignment mark includes a first template-side mark and a second template-side mark, the first template-side mark including a first pattern in which a plurality of first portions are arranged with a first period in the first direction, the second template-side mark including a second pattern in which a plurality of second portions are arranged with a second period in the first direction, the second alignment mark includes a first wafer-side mark and a second wafer-side mark, the first wafer-side mark including a third pattern in which a plurality of third portions are arranged with a third period in the first direction, the second wafer-side mark including a fourth pattern in which a plurality of fourth portions are arranged with a fourth period in the first direction, the first wafer-side mark and the first template-side mark are configured to be overlaid with each other to constitute a first moire mark, the second wafer-side mark and the second template-side mark are configured to be overlaid with each other to constitute a second moire mark, and an average period of the first moire mark and an average period of the second moire mark are different from each other.

2. The imprint apparatus according to claim 1, wherein the first period and the third period fall within a range of difference equal to or less than 10% from the average period of the first moire mark, and the second period and the fourth period fall within a range of difference equal to or less than 10% from the average period of the second moire mark.

3. The imprint apparatus according to claim 2, wherein, where the average period of the first moire mark is denoted by $P1_{ave}$, and the average period of the second moire mark is denoted by $P2_{ave}$, a relation of a following formula (15) is satisfied.

$$\sqrt{2}P1_{ave} \leq P2_{ave} \tag{15}$$

4. The imprint apparatus according to claim 1, wherein the first portions, the second portions, the third portions, and the fourth portions are line patterns, the average period $P2_{ave}$ of the second moire mark is larger than the average period $P1_{ave}$ of the first moire mark, and where a positional error generated by coarse positioning between the template and the processing object is denoted by $\Delta x$, a relation of a following formula (16) is satisfied.

$$\Delta x < P2_{ave}/2 \tag{16}$$

5. The imprint apparatus according to claim 1, wherein where the first portions and the second portions are line patterns, and the third portions and the fourth portions are periodic patterns of respective checkered patterns, or where the first portions and the second portions are periodic patterns of respective checkered patterns, and the third portions and the fourth portions are line patterns, the average period $P2_{ave}$ of the second moire mark is larger than the average period $P1_{ave}$ of the first moire mark, and where a positional error generated by coarse positioning between the template and the processing object is denoted by $\Delta x$, a relation of a following formula (17) is satisfied.

$$\Delta x < P2_{ave}/4 \tag{17}$$

6. The imprint apparatus according to claim 1, wherein the first template-side mark includes a fifth pattern in which a plurality of fifth portions are arranged with a fifth period different from the first period in the first direction, the second template-side mark includes a sixth pattern in which a plurality of sixth portions are arranged with a sixth period different from the second period in the first direction, the first wafer-side mark includes a seventh pattern in which a plurality of seventh portions are arranged with a seventh period different from the third period in the first direction, the second wafer-side mark includes an eighth pattern in which a plurality of eighth portions are arranged with an eighth period different from the fourth period in the first direction, the fifth pattern is arranged adjacent to the first pattern in a second direction orthogonal to the first direction, the sixth pattern is arranged adjacent to the second pattern in the second direction, the seventh pattern is arranged adjacent to the third pattern in the second direction, the eighth pattern is arranged adjacent to the fourth pattern in the second direction, the fifth pattern and the seventh pattern are configured to be overlaid with each other to constitute a third moire mark, the sixth pattern and the eighth pattern are configured to be overlaid with each other to constitute a fourth moire mark, and an average period of the third moire mark and an average period of the fourth moire mark are different from each other.

7. The imprint apparatus according to claim 6, wherein the first period is equal to the seventh period, the second period is equal to the eighth period, the third period is equal to the fifth period, and the fourth period is equal to the sixth period.

8. The imprint apparatus according to claim 1, further comprising a second moving part that moves at least one of the template holder and the processing object holder in a second direction orthogonal to the first direction, on a basis of a monitoring result obtained by the monitor, wherein the template includes a third alignment mark detecting displacement in the second direction, the processing object includes a fourth alignment mark detecting displacement in the second direction, and the third alignment mark and the fourth alignment mark are marks obtained by rotating the first alignment mark and the second alignment mark, respectively, by 90° in a plane defined by the first direction and the second direction.

9. An imprint method comprising:

arranging a template and a processing object to face each other, the template including a first alignment mark detecting displacement in a first direction, the processing object including a second alignment mark detecting displacement in the first direction;

performing first positioning by moving at least one of the template and the processing object in the first direction, by using a reference position provided on the template and the processing object;

applying a resist onto the processing object;

bringing the template into contact with the resist;

optically monitoring a state where the first alignment mark and the second alignment mark are overlaid with each other, under a state where the template is set in contact with the resist; and performing second positioning by moving at least one of the template and the processing object in the first direction, on a basis of a monitoring result, wherein the first alignment mark includes a first template-side mark and a second template-side mark, the first template-side mark including a first pattern in which a plurality of first portions are arranged with a first period in the first direction, the second template-side mark including a second pattern in which a plurality of second portions are arranged with a second period in the first direction, the second alignment mark includes a first wafer-side mark and a second wafer-side mark, the first wafer-side mark including a third pattern in which a plurality of third portions are arranged with a third period in the first direction, the second wafer-side mark including a fourth pattern in which a plurality of fourth portions are arranged with a fourth period in the first direction, the first wafer-side mark and the first template-side mark are configured to be overlaid with each other to constitute a first moire mark, the second wafer-side mark and the second template-side mark are configured to be overlaid with each other to constitute a second moire mark, and an average period of the first moire mark and an average period of the second moire mark are different from each other.

10. The imprint method according to claim 9, wherein the first period and the third period fall within a range of difference equal to or less than 10% from the average period of the first moire mark, and the second period and the fourth period fall within a range of difference equal to or less than 10% from the average period of the second moire mark.

11. The imprint method according to claim 10, wherein, where the average period of the first moire mark is denoted by $P1_{ave}$, and the average period of the second moire mark is denoted by $P2_{ave}$, a relation of a following formula (18) is satisfied.

$$\sqrt{2}P1_{ave} \leq P2_{ave} \tag{18}$$

12. The imprint method according to claim 9, wherein the first portions, the second portions, the third portions, and the fourth portions are line patterns, the average period $P2_{ave}$ of the second moire mark is larger than the average period $P1_{ave}$ of the first moire mark, and where a positional error generated by coarse positioning between the template and the processing object is denoted by Δx, a relation of a following formula (19) is satisfied.

$$\Delta x < P2_{ave}/2 \tag{19}$$

13. The imprint method according to claim 9, wherein where the first portions and the second portions are line patterns, and the third portions and the fourth portions are periodic patterns of respective checkered patterns, or where the first portions and the second portions are periodic patterns of respective checkered patterns, and the third portions and the fourth portions are line patterns, the average period $P2_{ave}$ of the second moire mark is larger than the average period $P1_{ave}$ of the first moire mark, and where a positional error generated by coarse positioning between the template and the processing object is denoted by Δx, a relation of a following formula (20) is satisfied.

$$\Delta x < P2_{ave}/4 \tag{20}$$

14. The imprint method according to claim 9, wherein the first template-side mark includes a fifth pattern in which a plurality of fifth portions are arranged with a fifth period different from the first period in the first direction, the second template-side mark includes a sixth pattern in which a plurality of sixth portions are arranged with a sixth period different from the second period in the first direction, the first wafer-side mark includes a seventh pattern in which a plurality of seventh portions are arranged with a seventh period different from the third period in the first direction, the second wafer-side mark includes an eighth pattern in which a plurality of eighth portions are arranged with an eighth period different from the fourth period in the first direction, the fifth pattern is arranged adjacent to the first pattern in a second direction orthogonal to the first direction, the sixth pattern is arranged adjacent to the second pattern in the second direction, the seventh pattern is arranged adjacent to the third pattern in the second direction, the eighth pattern is arranged adjacent to the fourth pattern in the second direction, the fifth pattern and the seventh pattern are configured to be overlaid with each other to constitute a third moire mark, the sixth pattern and the eighth pattern are configured to be overlaid with each other to constitute a fourth moire mark, and an average period of the third moire mark and an average period of the fourth moire mark are different from each other.

15. The imprint method according to claim 14, wherein the first period is equal to the seventh period, the second period is equal to the eighth period, the third period is equal to the fifth period, and the fourth period is equal to the sixth period.

16. The imprint method according to claim 9, wherein in the performing of the first positioning, the first positioning is performed by moving at least one of the template and the processing object in a second direction orthogonal to the first direction in addition to the first direction, in the performing of the second positioning, the second positioning is performed by moving at least one of the template and the processing object in the second direction in addition to the first direction, on a basis of the monitoring result, the template includes a third alignment mark detecting displacement in the second direction, the processing object includes a fourth alignment mark detecting displacement in the second direction, and the third alignment mark and the fourth alignment mark are marks obtained by rotating the first alignment mark and the second alignment mark, respectively, by 90° in a plane defined by the first direction and the second direction.

17. An imprint method comprising:

arranging a template and a processing object to face each other, the template including a first alignment mark detecting displacement in a first direction, the processing object including a second alignment mark detecting displacement in the first direction;

performing first positioning by moving at least one of the template and the processing object in the first direction, by using a reference position provided on the template and the processing object;

applying a resist onto the processing object;

bringing the template into contact with the resist;

optically monitoring a state where the first alignment mark and the second alignment mark are overlaid with each other, under a state where the template is set in contact with the resist; and performing second positioning by moving at least one of the template and the processing object in the first direction, on a basis of a monitoring result, wherein the first alignment mark includes a first template-side mark including a first pattern in which a plurality of first portions are arranged with a first period in the first direction, the second alignment mark includes a first wafer-side mark including a second pattern in which a plurality of a second portions are arranged with a second period in the first direction, the first wafer-side mark and the first template-side mark are configured to be overlaid with each other to constitute a first moire mark, in the performing of the first positioning, the first positioning is performed by moving at least one of the template and the processing object in a second direction orthogonal to the first direction in addition to the first direction, in the performing of the second positioning, the second positioning is performed by moving at least one of the template and the processing object in the second direction in addition to the first direction, on a basis of the monitoring result, the template includes a third alignment mark detecting displacement in the second direction, the processing object includes a fourth alignment mark detecting displacement in the second direction, and the third alignment mark and the fourth alignment mark are marks obtained by rotating the first alignment mark and the second alignment mark, respectively, by 90° in a plane defined by the first direction and the second direction.

18. The imprint method according to claim 17, wherein the first period and the second period fall within a range of difference equal to or less than 10% from an average period of the first moire mark.

* * * * *